US007138890B2

(12) United States Patent
Nakamura et al.

(10) Patent No.: US 7,138,890 B2
(45) Date of Patent: Nov. 21, 2006

(54) SURFACE ACOUSTIC WAVE (SAW) RESONATOR SAW FILTER AND SAW ANTENNA DUPLEXER USING THE SAW RESONATOR

(75) Inventors: Hiroyuki Nakamura, Osaka (JP); Shunichi Seki, Hyogo (JP); Kazunori Nishimura, Kyoto (JP); Toru Sakuragawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/357,211

(22) Filed: Feb. 21, 2006

(65) Prior Publication Data

US 2006/0139126 A1    Jun. 29, 2006

Related U.S. Application Data

(62) Division of application No. 10/809,427, filed on Mar. 26, 2004, now Pat. No. 7,034,634.

(30) Foreign Application Priority Data

Mar. 28, 2003  (JP)  ............................. 2003-091180
Nov. 27, 2003  (JP)  ............................. 2003-396886

(51) Int. Cl.
    *H03H 9/64* (2006.01)
(52) U.S. Cl. ................ 333/195; 310/313 B; 310/313 D
(58) Field of Classification Search ................ 333/193, 333/195; 310/313 B, 313 D
    See application file for complete search history.

(56) References Cited

U.S. PATENT DOCUMENTS

| 4,162,415 A | 7/1979 | Andreev et al. ......... 310/313 B |
| 4,355,290 A | 10/1982 | Bagdasarian et al. ....... 333/195 |
| 4,393,321 A | 7/1983 | Bagdasarian et al. ... 310/313 B |
| 5,363,073 A | 11/1994 | Higgins ...................... 333/195 |
| 6,903,626 B1 | 6/2005 | Tsutsumi et al. ........... 333/133 |
| 7,034,634 B1 * | 4/2006 | Nakamura et al. .......... 333/133 |

FOREIGN PATENT DOCUMENTS

| DE | 100 57 848 A1 | 5/2002 |
| EP | 1 189 346 A2 | 3/2002 |
| JP | 58-116813 A | 7/1983 |
| JP | 63-21869 | 2/1988 |
| JP | 64-54805 | * 3/1989 | ................. 333/193 |
| JP | 02081511 | 3/1990 |

(Continued)

OTHER PUBLICATIONS

Elastic Wave Element Technology Handbook, Ed. Elastic Wave Element Technology Committee No. 150, Japan Society for the Promotion of Science, pp. 195 and 208, Nov. 30, 1991, Ohmsha, Ltd. (translation).

(Continued)

*Primary Examiner*—Barbara Summons
(74) *Attorney, Agent, or Firm*—Wenderoth, Lind & Ponack, L.L.P.

(57) ABSTRACT

A SAW resonator includes an IDT electrode formed on a piezoelectric substrate and reflector electrodes disposed on both sides of the IDT electrode. The IDT electrode includes first finger-electrodes, second finger-electrodes and strip-line electrodes. The first and the second finger-electrodes do not overlap with each other but are acoustically coupled together by the strip-line electrodes. This acoustic coupling by the strip-line electrodes eliminates the need for a common bus-bar electrode, so that the loss caused by the resistance of the common bus-bar electrode can be reduced, and the SAW resonator can be downsized.

8 Claims, 16 Drawing Sheets

| FOREIGN PATENT DOCUMENTS | | |
|---|---|---|
| JP | 07074584 | 3/1995 |
| JP | 08298433 | 11/1996 |
| JP | 09093079 | 4/1997 |
| JP | 10-229317 A | 8/1998 |

OTHER PUBLICATIONS

Reindt, L., "Track-Changing Structures on YZ-LiNbO$_3$," IEEE Ultrasonics Symposium, Oct. 1997, vol. 1, pp. 77-82.

* cited by examiner

SURFACE ACOUSTIC WAVE (SAW) RESONATOR SAW FILTER AND SAW ANTENNA DUPLEXER USING THE SAW RESONATOR

This application is a divisional application of U.S. application Ser. No. 10/809,427, filed Mar. 26, 2004, now U.S. Pat. No. 7,034,634.

FIELD OF THE INVENTION

The present invention relates to a SAW resonator, and a SAW filter and an antenna duplexer employing this SAW resonator.

BACKGROUND OF THE INVENTION

Recent advances in mobile communication have enabled the devices employed therein to become smaller and more sophisticated. The surface acoustic wave filter (hereinafter referred to simply as a SAW filter) is widely used as a filter in mobile communication apparatuses. SAW filters used in an RF (radio frequency) stage comprise two types: a longitudinally coupled type and a ladder type. The ladder SAW filter has lower loss than a vertical mode SAW filter. The ladder model is formed of a plurality of SAW resonators coupled to each other in a ladder form. Thus, the sophistication of the SAW filter depends on the sophistication of each one of the SAW resonators.

A conventional SAW filter is described hereinafter with reference to FIG. 15. FIG. 15 shows a plan view of a conventional SAW resonator 1500. The SAW resonator 1500 includes an interdigital transducer (IDT) electrode 1504 formed on a piezoelectric substrate 1502 and reflector electrodes 1514 disposed on both sides of IDT electrode 1504.

The IDT electrode 1504 includes a first bus bar electrode 1506; first finger-electrodes 1508 coupled to the first bus bar electrode 1506; a second bus bar electrode 1510; and second finger-electrodes 1512 coupled to the second bus bar electrode 1510. First finger-electrodes 1508 and second finger-electrodes 1512 overlap each other, and both first finger-electrodes 1508 and second finger-electrodes 1512 are arranged such that their respective pitches agree with wavelength $\lambda$ of the surface acoustic wave (SAW).

Each one of reflector electrodes 1514, disposed on both sides of IDT electrode 1504, is formed of a plurality of strip-line electrodes 1516 electrically shorted to one another by a common reflector electrode 1518. First bus-bar electrode 1506 is coupled to a first terminal 1520, and second bus-bar electrode 1510 is coupled to a second terminal 1522. Thus, SAW resonator 1500 is formed of a pair of terminals.

Use of the conventional SAW resonator 1500 in a SAW filter or an antenna duplexer does not provide desirable filter characteristics or high power durability. Therefore, the conventional SAW resonator has undergone a variety of improvements to its structure.

FIG. 16 shows a plan view illustrating the conventional SAW resonators 1500 coupled in series, thereby forming a SAW resonator 1530. This formation is used for improving the high power durability. SAW resonator 1530 is formed of two resonating units 1532 and 1534 coupled by a connecting electrode 1536 on a piezoelectric substrate 1502. Each one of resonating units 1532 and 1534 has the same structure as SAW resonator 1500 shown in FIG. 15, and thus the description thereof is omitted. A first terminal 1520 and a second terminal 1522 are respectively coupled to the bus-bar electrodes of resonating units 1532 and 1534.

If the capacitance of SAW resonator 1530 is designed to be equal to the capacitance of SAW resonator 1500 shown in FIG. 15, the two resonators will have approximately equal characteristics. In this case, since the SAW resonator 1530 is formed of two resonating units 1532 and 1534 coupled in series, each of their capacitances is designed to be twice as much as the capacitance of SAW resonator 1500. For this purpose, the number of pairs of IDT electrodes forming resonating units 1532 and 1534 is doubled, namely, the number of finger-electrodes of the IDT electrodes is doubled.

FIG. 17 shows a SAW resonator 1540 that employs a common bus-bar electrode 1538 shared by two resonating units 1532 and 1534 in SAW resonator 1530 shown in FIG. 16, so that connecting electrode 1536, as shown in FIG. 16, can be eliminated.

Further, Japanese Patent Application Non-Examined Publication No. H07-74584 discloses a SAW filter which improves the high power durability. The SAW filter includes at least two SAW resonators, wherein each SAW resonator includes a comb electrode for exciting and detecting a SAW and a reflector electrode for reflecting the SAW excited by the comb electrode, where the comb electrode of at least one of the SAW resonators has a split-electrode structure.

Japanese Patent Application Non-Examined Publication No. H08-298433 discloses another SAW filter which improves the high power durability. This SAW filter also employs a plurality of SAW resonators.

A transversal SAW filter, which is not designed to improve the high power durability, assigns weights to an input IDT electrode and an output IDT electrode in order to obtain desirable frequency characteristics. FIG. 18 shows a basic structure of a transversal SAW filter 1542. Transveral SAW filter 1542 is formed of an input IDT electrode 1546 and an output IDT electrode 1548, both placed on a piezoelectric substrate 1544. An input signal Vs is supplied to input IDT electrode 1546 and is transformed into a SAW for propagating to output IDT electrode 1548 on the surface of substrate 1544. The SAW arrives at output IDT electrode 1548, where the SAW is transformed into an electric signal, and then taken out as an output signal across a load RL.

FIG. 19 shows an example of assigning weights to electrodes for changing an exciting strength. This example illustrates only a part of input IDT electrode 1546, which is formed of a first pattern section 1550, second pattern sections 1552 and third pattern sections 1554. In the first pattern section 1550, respective finger-electrodes overlap with each other. In each one of second pattern sections 1552, respective finger-electrodes do not overlap with each other, but one dogleg electrode is placed between the finger-electrodes such that the dogleg is adjacent to the respective finger-electrodes. In each one of third pattern sections 1554, the finger-electrodes also do not overlap with each other, but two dogleg electrodes are placed between the finger-electrodes adjacent to one another. As FIG. 19 shows, the three patterns have different lengths of finger-electrodes. The patterns are optimally arranged along the SAW propagating direction, thereby obtaining desirable frequency characteristics.

FIG. 20 shows an example of assigning weights to electrodes using capacitive coupling. This example shows only one input IDT electrode 1556. In this case, finger-electrodes 1558 and 1560 of IDT electrode 1556 do not overlap with each other but, instead, are placed in a face-to-face manner. A coupling electrode 1562 placed between finger-electrodes 1558 and 1560 forms a capacitive coupling section 1564 and a voltage weighted section 1566 in IDT electrode 1556. The length of coupling electrode 1562 in section 1564 is adjusted to have a length different from other coupling electrodes 5622, so that capacitance C1 belongs to a coupling electrode 5621 and capacitance C2 belongs to coupling electrode 5622. On the other hand, each one of the capacitances in voltage weighted section 1566 is "Ce".

The foregoing weighting method using capacitive coupling is employed in the transversal SAW filter. In other words, a size of capacitive coupling is changed along the SAW propagating direction, thereby assigning weights. Then the weighting is optimized in order to maintain desirable frequency characteristics in the transversal SAW filter. These techniques are disclosed on pages 195 and 208 of the surface-acoustic-wave handbook edited by the 150th sub-committee of the Science Advancement Council of Japan.

However, since SAW resonator 1530 shown in FIG. 16 includes connecting electrode 1536 and a bus-bar electrode for coupling resonating units 1532 and 1534 in series, it is difficult to downsize the SAW resonator. SAW resonator 1540 shown in FIG. 17 eliminates a coupling electrode, so that it can be downsized accordingly. However, the width of common bus-bar electrode 1538 shared by resonating units 1532 and 1534 is narrowed, and the resistive component due to this narrower width produces negative influences on the characteristic of the SAW resonator 1540, e.g., increasing loss. A greater number of pairs of IDT electrodes, in particular, elongates common bus-bar electrode 1538, and the negative influence becomes more conspicuous.

SUMMARY OF THE INVENTION

The present invention addresses the problems discussed above, and aims to provide a downsized SAW resonator having a smaller loss, the SAW resonator being formed of resonating units coupled in series. The present invention also aims to provide a SAW filter and an antenna duplexer employing the SAW resonator of the present invention.

The SAW resonator of the present invention includes a piezoelectric substrate; an interdigital transducer (IDT) electrode formed on the piezoelectric substrate; and reflector electrodes adjacent to the IDT electrode. The IDT electrode includes first finger-electrodes; second finger-electrodes; and strip-line electrodes. The first finger-electrodes and the second finger-electrodes do not overlap with each other, but are coupled acoustically together by the strip-line electrodes.

The foregoing structure eliminates the need for a common bus-bar electrode because the strip-line electrode couples the finger-electrodes together, thereby providing a SAW resonator having a decreased size. As a result, the characteristics of the SAW resonator, the SAW filter and the antenna duplexer employing the SAW resonator can be improved, and these devices can be downsized as well.

BRIEF DESCRIPTION OF THE DRAWINGS

Aspects of illustrative, non-limiting embodiments of the present invention will become more apparent by describing in detail embodiments thereof with reference to the attached drawings, described briefly below.

DETAILED DESCRIPTION OF THE INVENTION

The SAW resonator, the SAW filter and the antenna duplexer of the present invention are described in detail with reference to the accompanying drawings. In the descriptions thereof, elements in the respective embodiments having the same reference marks and the descriptions thereof are sometimes omitted.

Exemplary Embodiment 1

Figure 1:
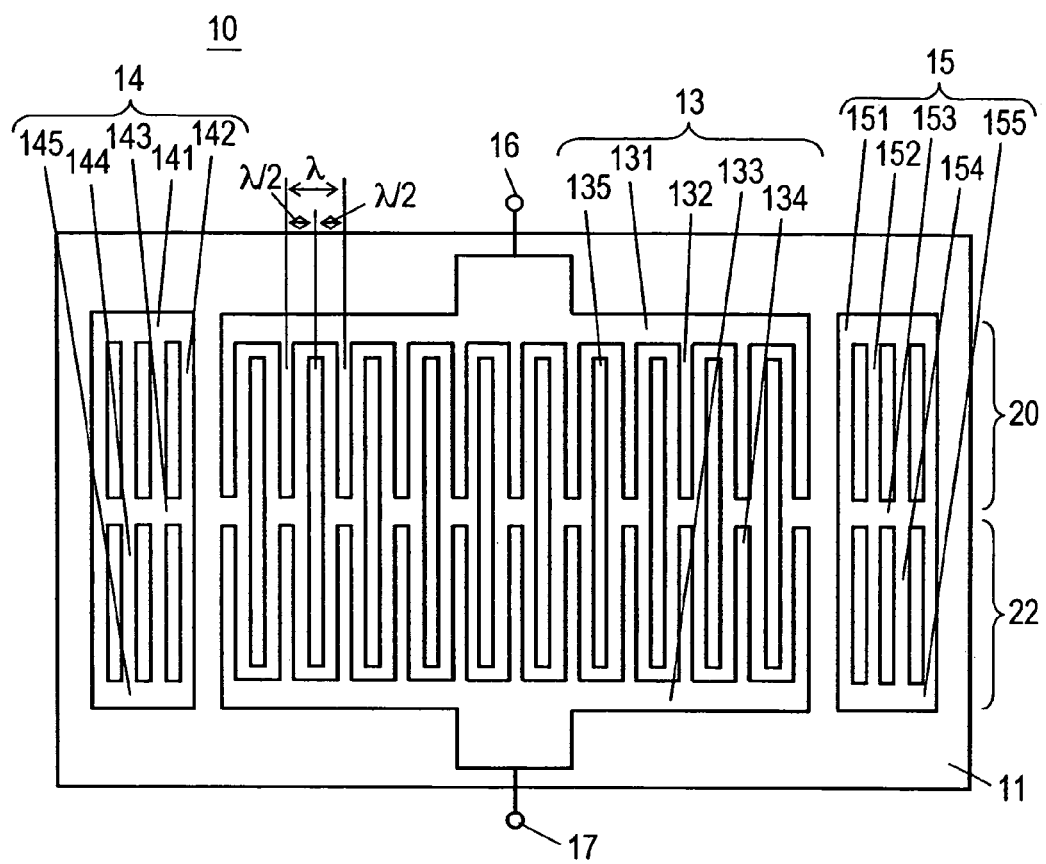
FIG. 1 shows a plan view illustrating a structure of a SAW resonator in accordance with a first exemplary embodiment of the present invention.

FIG. 1 shows a plan view illustrating a structure of the SAW resonator in accordance with the first exemplary embodiment of the present invention. A SAW resonator 10 includes an inter digital transducer (IDT) electrode 13 formed on a piezoelectric substrate 11; and reflector electrodes 14 and 15 disposed on both sides of the IDT electrode 13, wherein each of the reflector electrodes 14 and 15 is formed of two stages.

IDT electrode 13 includes a first bus-bar electrode 131; a plurality of first finger-electrodes 132 coupled to the first bus-bar electrode 131; a second bus-bar electrode 133; a plurality of second finger-electrodes 134 coupled to second bus-bar electrode 133; and a plurality of strip-line electrodes 135 shaped like a straight line standing alone.

Figure 3:
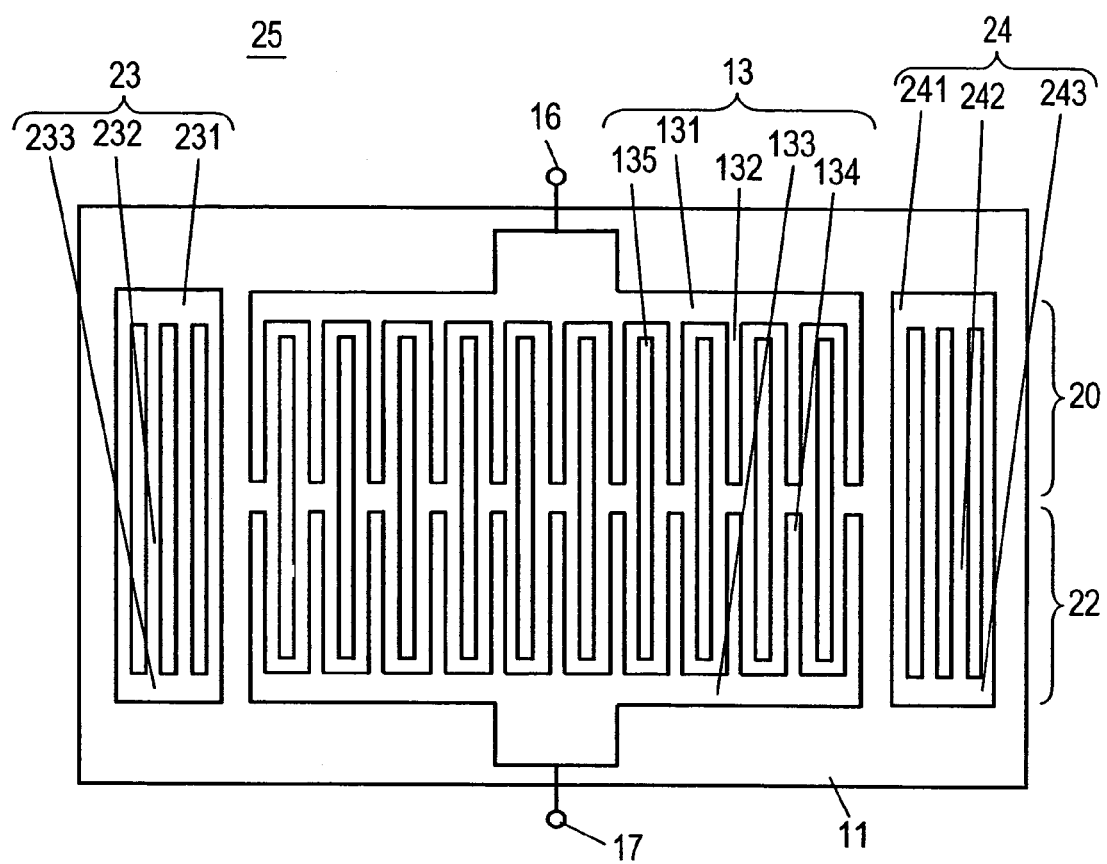
FIG. 3 shows a plan view illustrating a structure of a modified SAW resonator in accordance with the first embodiment.

Each one of first finger-electrodes 132 and second finger-electrodes 134 is arranged at intervals of wavelength λ of the SAW. The first finger-electrodes do not overlap the second finger-electrodes, but are arranged alike along the SAW propagating direction in a direct face-to-face manner with a given space in between. As shown in FIG. 3, each one of strip-line electrodes 135 is disposed such that it is spaced apart by λ/2 from the centers of respective first finger-electrodes 132 and second finger-electrodes 134. In addition, each of the strip-line electrodes 135 is disposed so as to overlap respective first finger-electrodes 132 and second finger-electrodes 134 wherein an overlap length of the strip-line electrodes 135 to respective first and second finger-electrodes is the same. Further, strip-line electrodes 135 are uniformly arranged along the propagating direction of the SAW resonator 10.

The reflector electrode 14 includes a plurality of strip-line electrodes 142 shorted by common reflector electrodes 141 and 143; and a plurality of strip-line electrodes 144 shorted by common reflector electrodes 143 and 145.

Reflector electrode 15 has a similar structure to electrode 14. In particular, the reflector electrode 15 includes a plurality of strip-line electrodes 152 shorted by common reflector electrodes 151 and 153; and a plurality of strip-line electrodes 154 shorted by common reflector electrodes 153 and 155. As shown in FIG. 1, reflector electrodes 14 and 15 are shaped alike. First bus-bar electrode 131 is coupled to a first terminal 16, and second bus-bar electrode 133 is coupled to a second terminal 17.

The structure discussed above allows a first section 20 to work as a first resonating unit having the characteristics of a SAW resonator, and also allows a second section 22 to work as a second resonating unit having the characteristics of the SAW resonator. Since these two sections are coupled acoustically together by strip-line electrodes 135, this structure is equivalent to two resonating units coupled in series.

In other words, first finger-electrodes 132 and strip-line electrodes 135 in the IDT electrode 13 form an IDT electrode pattern, and reflector electrodes 14 and 15 disposed on both sides of this pattern are formed so as to correspond to the pattern of the IDT electrode 13. Accordingly, the first section 20 forms a first resonating unit.

Similarly, second finger-electrodes 134 and strip-line electrodes in IDT electrode 13 form an IDT electrode pattern, and reflector electrodes 14 and 15 disposed on both sides of this pattern are formed so as to correspond to the pattern. Accordingly, the second section 22 forms a second resonating unit. Strip-line electrodes 135 are shared by first section 20 and second section 22, so that both of the sections are coupled together acoustically. Therefore, the first resonating unit and the second resonating unit are equivalently coupled in series. These resonating units have the characteristics of a SAW resonator.

In SAW resonator 10, the resonating unit of first section 20 and that of the second section 22 are coupled in series equivalently without using a common bus-bar electrode. As a result, a lower loss can be expected, and the resonator can be downsized proportionately due to the elimination of the common bus-bar electrode.

Figure 2A:
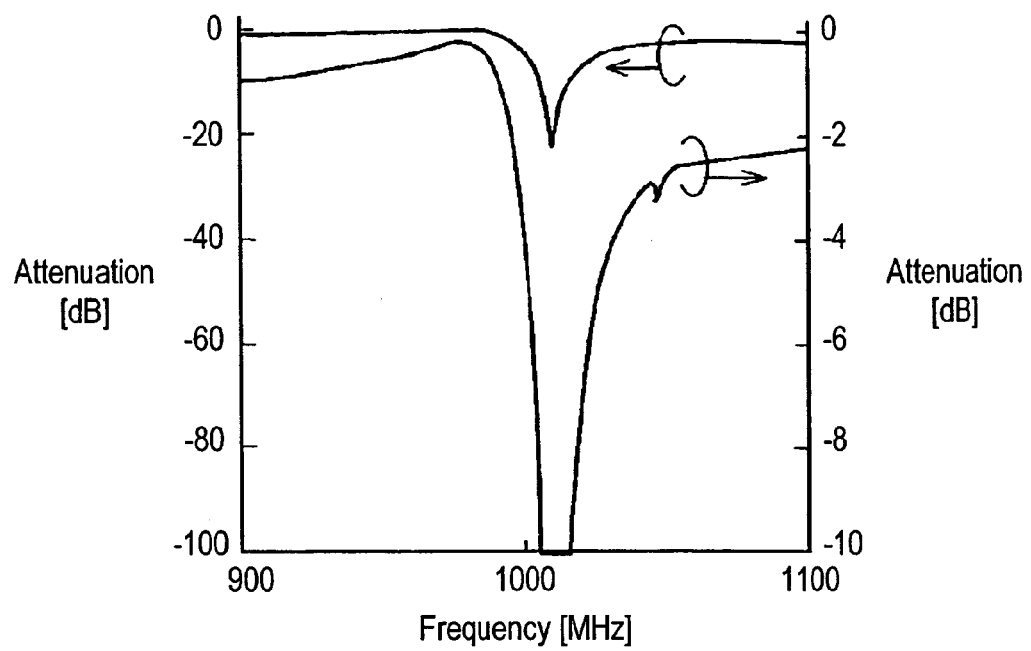
FIG. 2A shows transmission characteristics of the SAW resonator in the first embodiment.
Figure 2B:
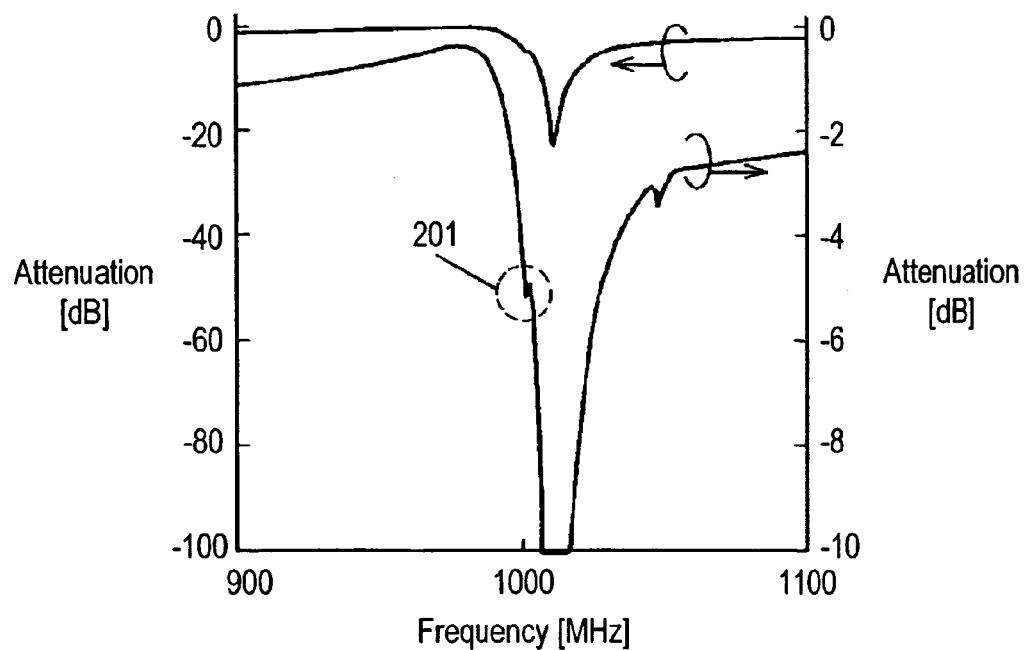
FIG. 2B shows transmission characteristics of a conventional SAW resonator.
Figure 17:
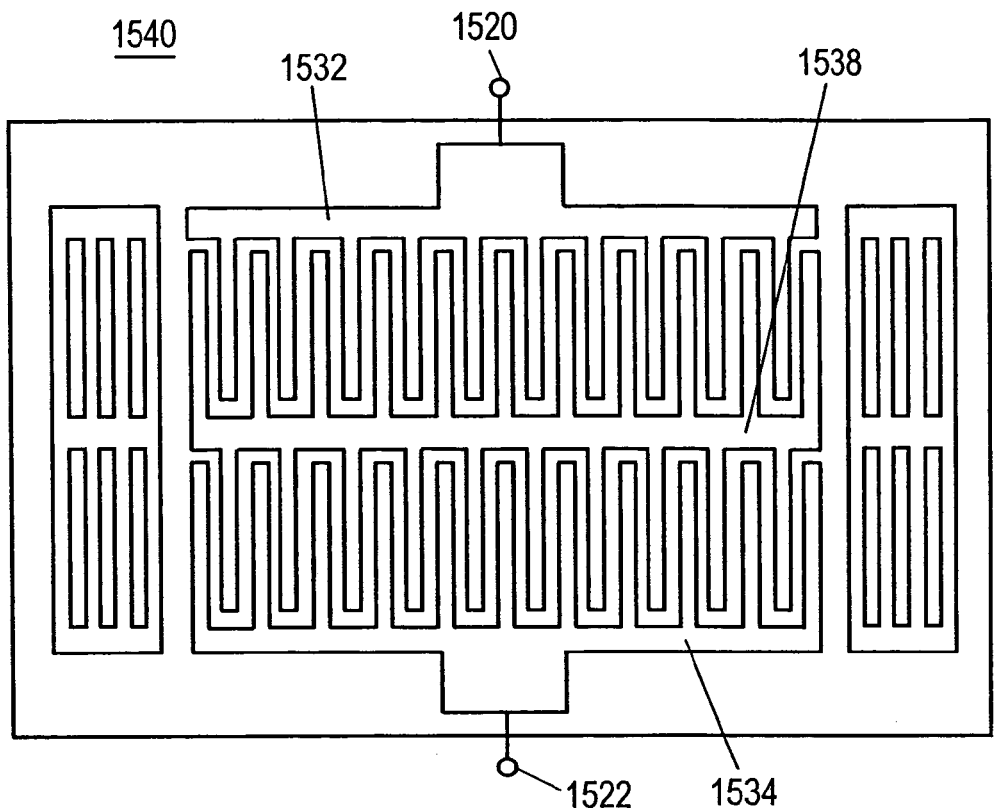
FIG. 17 shows a plan view illustrating a SAW resonator having a common bus-bar electrode.
Figure 18:
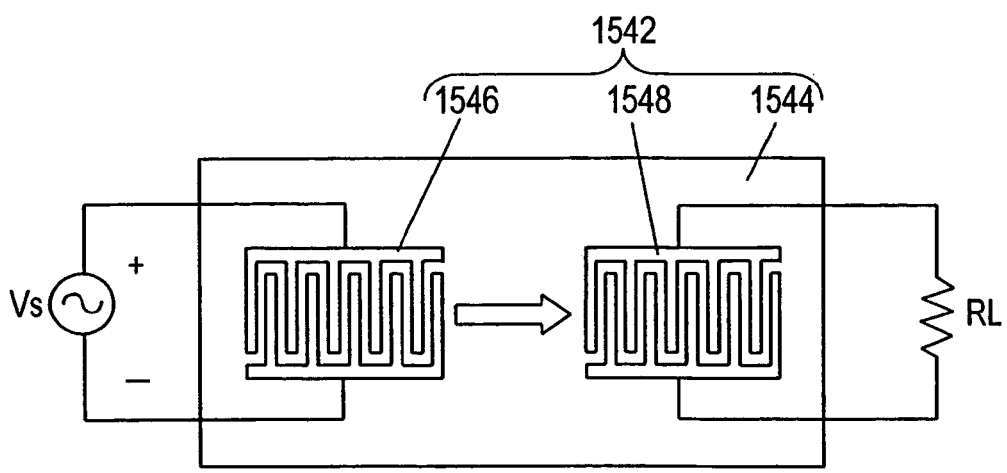
FIG. 18 shows a plan view illustrating a conventional transversal SAW filter.
Figure 19:
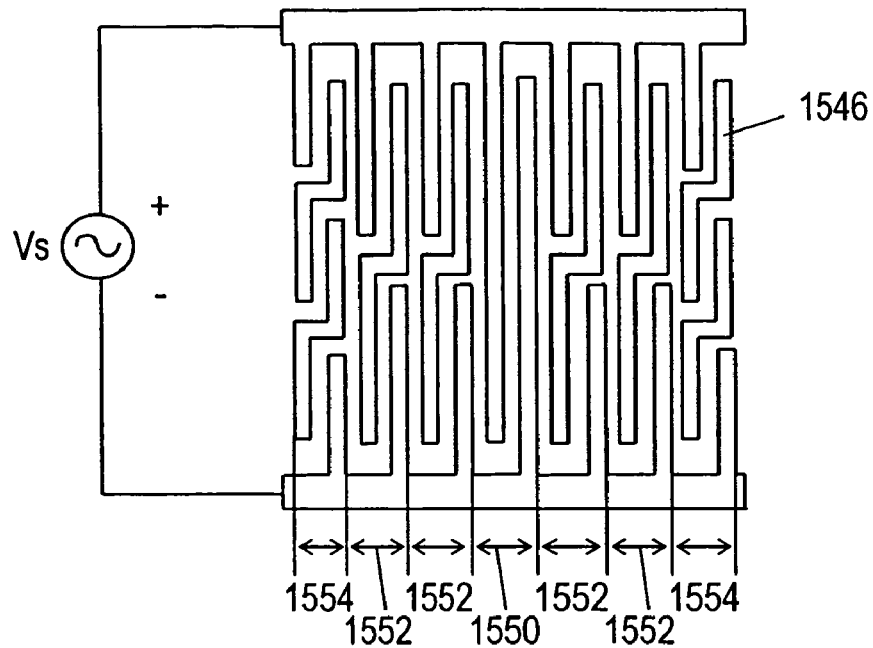
FIG. 19 shows a plan view illustrating an example of assigning weights to exciting strength in the SAW filter shown in FIG. 18.
Figure 20:
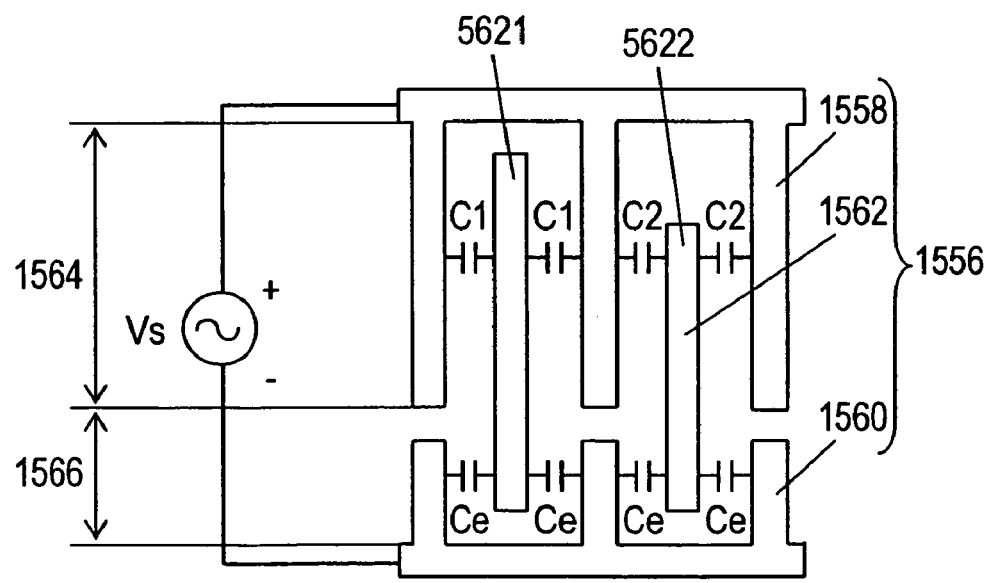
FIG. 20 shows a plan view illustrating an example of assigning weights to capacitive coupling in the SAW filter shown in FIG. 18.

FIG. 2A shows the characteristics of a transmission from first terminal 16 to second terminal 17 of SAW resonator 10. FIG. 2B shows the transmission characteristics of the conventional SAW resonator 1540 shown in FIG. 17.

In the first exemplary embodiment, the space between each first finger-electrode 132 and each second finger-electrode 134 is set at 3 µm (i.e., 3λ/4). In conventional SAW resonator 1540, the common bus-bar electrode has a width of 10 µm. Further, SAW resonator 10 of the first exemplary embodiment and conventional SAW resonator 1540 have the same parameters such as the number of pairs of finger-electrodes and the overlap length.

A comparison of FIG. 2A with FIG. 2B shows that a minimum loss of SAW resonator 10 is 0.3 dB and that of conventional SAW resonator 1540 is 0.4 dB, so that the SAW resonator 10 in accordance with the first exemplary embodiment can reduce the loss by 0.1 dB. As FIG. 2B shows, conventional SAW resonator 1540 produces a ripple 201 around the pass-band. This ripple is caused by the resistive component of the common bus-bar electrode and the discontinued section between the two resonating units. On the other hand, FIG. 2A shows no such ripple. In FIG. 2A and FIG. 2B, the X-axis represents a frequency, and the Y-axis represents an attenuation amount.

As discussed above, although SAW resonator 10 in accordance with the first exemplary embodiment includes first finger-electrodes 132 and second-finger electrodes 134 that do not overlap with each other, a plurality of strip-line electrodes 135 can couple them acoustically, thereby providing excellent transmission characteristics. In other words, in the SAW resonator in accordance with the first exemplary embodiment, although the resonating units are coupled in series, an amount of loss can be suppressed. As a result, a SAW resonator having low loss and excellent high power durability is obtained.

FIG. 3 shows a plan view illustrating a modified SAW resonator 25 in accordance with the first embodiment. As shown in FIG. 3, modified SAW resonator 25 includes reflector electrodes 23 and 24 having a different structure than reflector electrodes 14 and 15, respectively. In particular, reflector electrode 23 on the left side of the SAW resonator 25 is formed of a plurality of strip-line electrodes 232 electrically shorted by common reflector electrodes 231 and 233. Reflector electrode 24 on the right side of the SAW resonator 25 is formed of a plurality of strip-line electrodes 242 electrically shorted by common reflector electrodes 241 and 243. As such, there is no common reflector electrode at the center of the reflector electrodes 23 and 24, which differs from SAW resonator 10. The two reflector electrodes 23 and 24 are shaped alike. The structure shown in FIG. 3 still allows first section 20 to work as the first resonating unit and second section 22 to work as the second resonating unit, the first and second resonating units having the characteristics of the SAW resonator.

Figure 4:
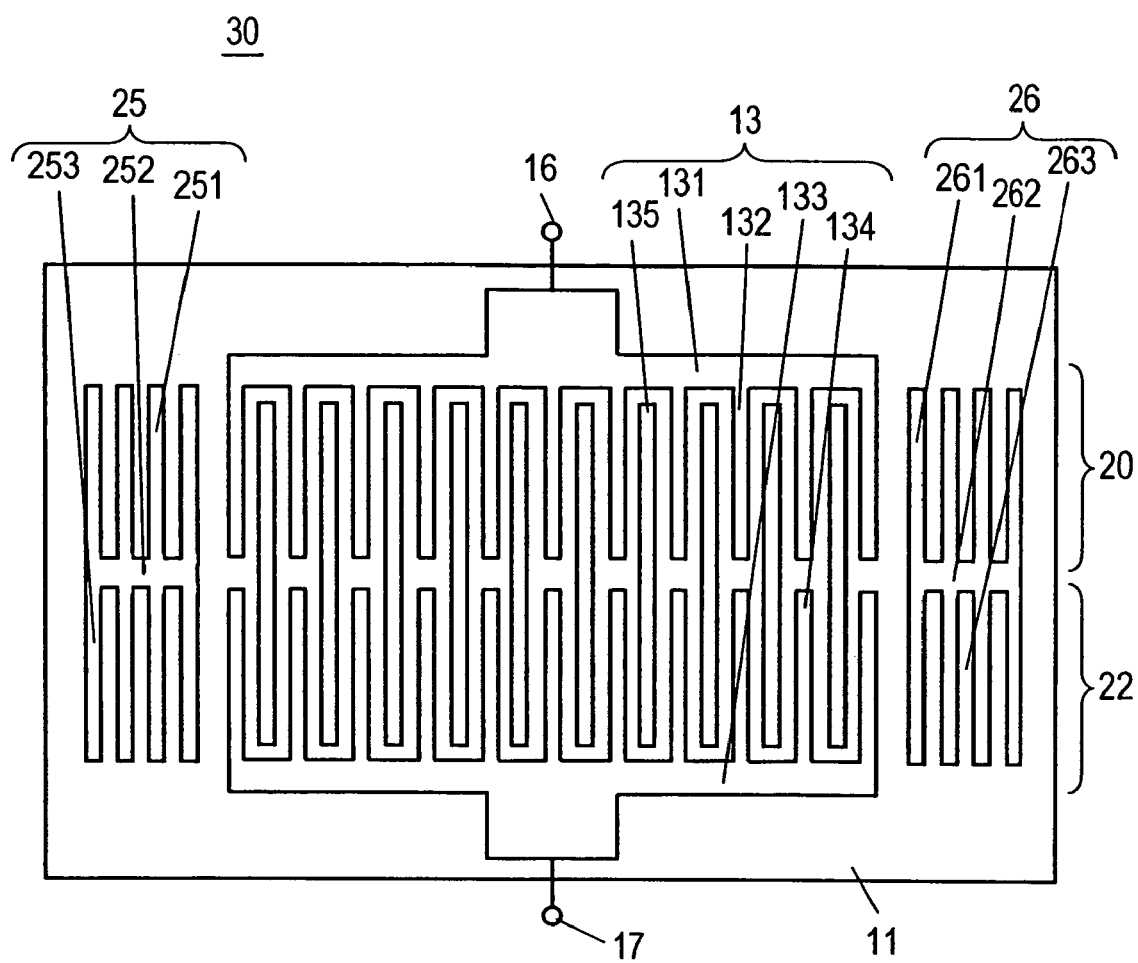
FIG. 4 shows a plan view illustrating a structure of another modified SAW resonator in accordance with the first embodiment.

FIG. 4 shows a plan view of another modified SAW resonator 30 in accordance with the first embodiment. As FIG. 4 shows, modified SAW resonator 30 includes reflector electrodes 25 and 26 having a different structure than reflector electrodes shown in FIGS. 1 and 3. In particular, the reflector electrode 25 on the left side of the SAW resonator 30 has a common reflector electrode 252 at its center. The first ends of strip-line electrodes 251 and 253 are coupled to the common reflector electrode 252, and the second ends thereof are open. The reflector electrode 26 on the right side of SAW resonator 30 has a common reflector electrode 262 at its center. The first ends of strip-line electrodes 261 and 263 are coupled to common reflector electrode 262, and the second ends thereof are open. As such, the common reflector electrodes 252 and 262 are prepared only at the center of the reflector electrodes 25 and 26, which differs from SAW resonator 10. The two reflector electrodes 25 and 26 are shaped alike. The structure shown in FIG. 4 still allows first section 20 to work as the first resonating unit and second section 22 to work as the second resonating unit, the first and second resonating units having the characteristics of a SAW resonator.

Figure 5:
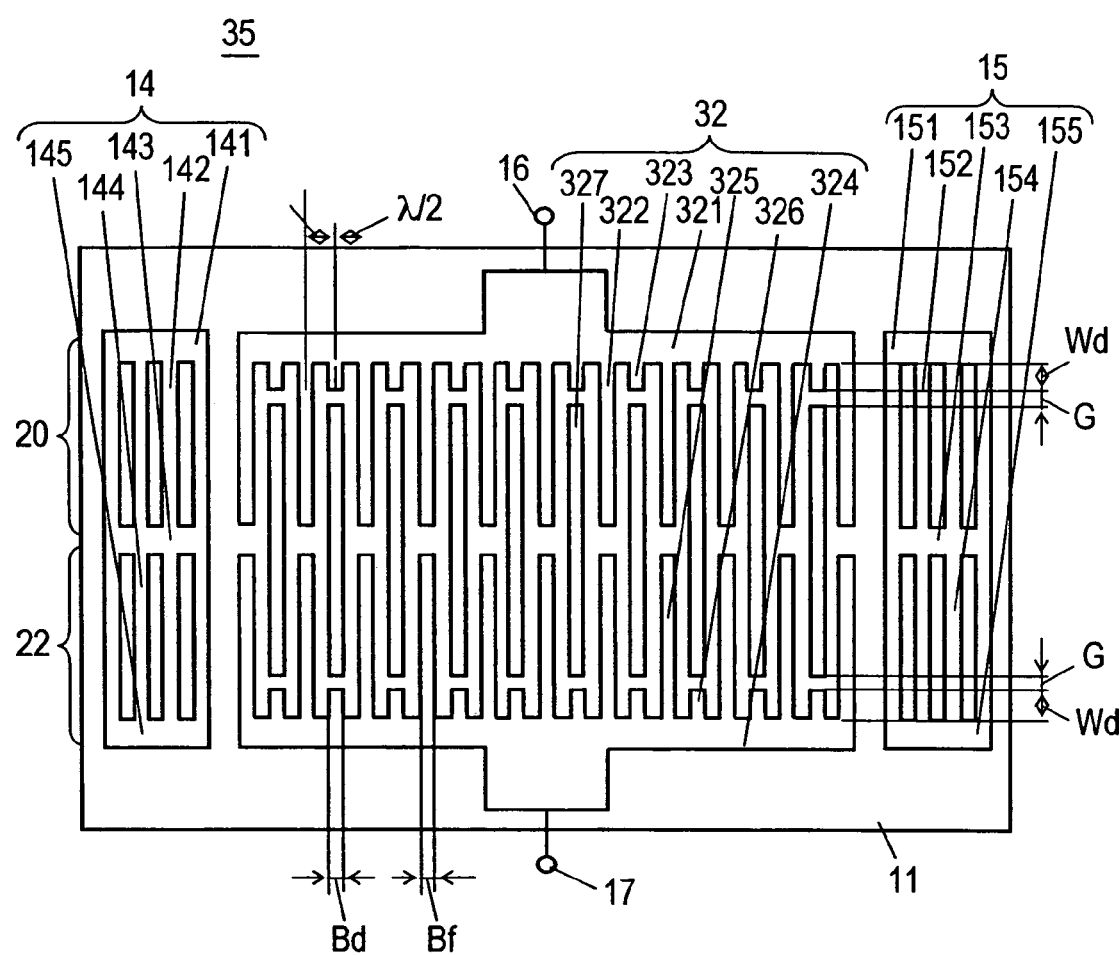
FIG. 5 shows a plan view illustrating a structure of another modified SAW resonator in accordance with the first embodiment.

FIG. 5 shows a plan view of still another modified SAW resonator 35 in accordance with the first embodiment. This modified SAW resonator 35 has a different structure in IDT electrode 32 than that of SAW resonator 10. In particular, IDT electrode 32 of SAW resonator 35 includes first finger-electrodes 322 and first dummy electrodes 323 coupled to a first bus-bar electrode 321; second finger-electrodes 325 and second dummy electrodes 326 coupled to a second bus-bar electrode 324; and strip-line electrodes 327. SAW resonator 35 has reflector electrodes 14 and 15 which are the same as those of SAW resonator 10.

As shown in FIG. 5, first dummy electrodes 323 and second dummy electrodes 326 are formed at a space which is generated by shortening strip-line electrodes 327. First dummy electrodes 323 are disposed between respective first finger-electrodes 322 and coupled to a first bus-bar electrode 321. Second dummy electrodes 326 are disposed between respective second finger-electrodes 325 and coupled to a second bus-bar electrode 324.

Assume that first dummy electrodes 323 and second dummy electrodes 326 have a length of "Wd", and if Wd≧0.5λ.(λ=wavelength of the SAW), the leakage of the SAW to respective bus-bar electrodes 321 and 324 can be reduced effectively. Assume that a space G is formed between first dummy electrodes 323 and strip-line electrodes 327, and space G is also formed between second dummy electrodes 326 and the strip-line electrodes 327. If G≦0.25λ (λ=wavelength of the SAW), the leakage of the SAW to respective bus-bar electrodes 321 and 324 can also be reduced effectively. Assume that first dummy electrodes 323 and the second dummy electrodes 326 have a width of "Bd", and first finger-electrodes 322 and second finger-electrodes 325 have a width of "Bf", and if Bd>Bf, the leakage of the SAW to respective bus-bar electrodes 321 and 324 can be further reduced.

The length of "Wd" is preferably set at a value greater than 0.5λ. However, its upper limit is determined by the length of strip-line electrodes 327 and the space G, which cannot be more than 0.25λ. The lower limit of "Wd" can be a clearance accepting a photolithography-process or etching-process. The overlap length of strip-line electrodes 327 with first finger-electrodes 322 and second finger-electrodes 325 is designed optimally by using impedance and the like.

Width "Bd" of the first dummy electrodes 323 and second dummy electrodes 326 should be determined so as not to touch the adjacent first finger-electrodes 322 and second finger-electrodes 325.

Although this modified SAW resonator 35 has resonating units coupled in series, the loss can be suppressed, so that a SAW resonator having low loss and excellent high power durability is obtained. Further, the leakage of the SAW to the bus-bar electrodes can be reduced.

The structure of the reflector electrodes in accordance with the first embodiment is not limited to what is discussed above. Any structure that can confine the SAW therein is acceptable.

In the foregoing SAW resonators, the resonating units in the first and the second sections have the same overlap length of the respective finger-electrodes with the respective strip-line electrodes. However, the present invention is not limited to this structure. The capacitance can be adjusted by changing the respective overlap lengths.

The first resonating unit can have a different resonance frequency from that of the second resonating unit as long as they are acoustically coupled together by the strip-line electrodes.

In the first exemplary embodiment, a space of 3 μm (3λ/4) is formed between the first finger-electrodes and the second finger-electrodes in order to measure the characteristics shown in FIG. 2A. However, the present invention is not limited to this structure, and the space can be an optimum value according to a desired design.

Figure 15:
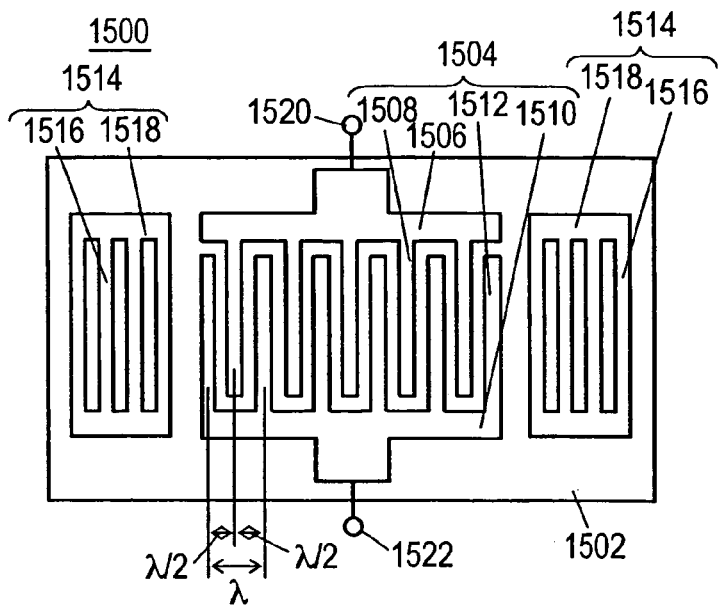
FIG. 15 shows a plan view illustrating a structure of a typical conventional SAW resonator.
Figure 16:
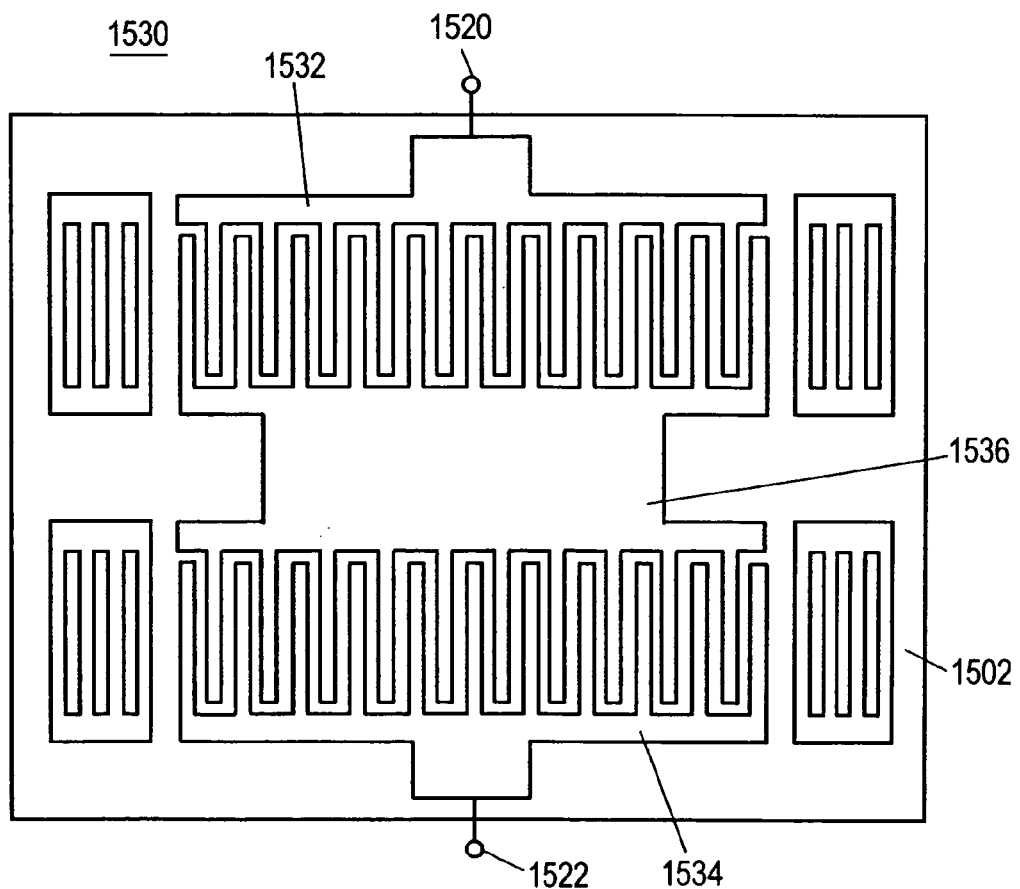
FIG. 16 shows a plan view illustrating a conventional SAW resonator having a series coupling.

In the first exemplary embodiment, every first finger-electrode and every second finger-electrode forming the IDT electrode are acoustically coupled together by the strip-line electrodes. However, the present invention is not limited to this structure. For example, parts of the sections can be coupled acoustically, or the IDT electrode used in the conventional SAW resonator shown in FIG. 15 can be included.

As discussed above, the SAW resonator of the present invention includes two resonating units coupled together acoustically by the strip-line electrodes, and the resonating units are coupled in series. This structure reduces the loss and allows downsizing of the resonator. As a result, a SAW resonator having excellent transmission characteristics is obtained.

Exemplary Embodiment 2

Figure 6:
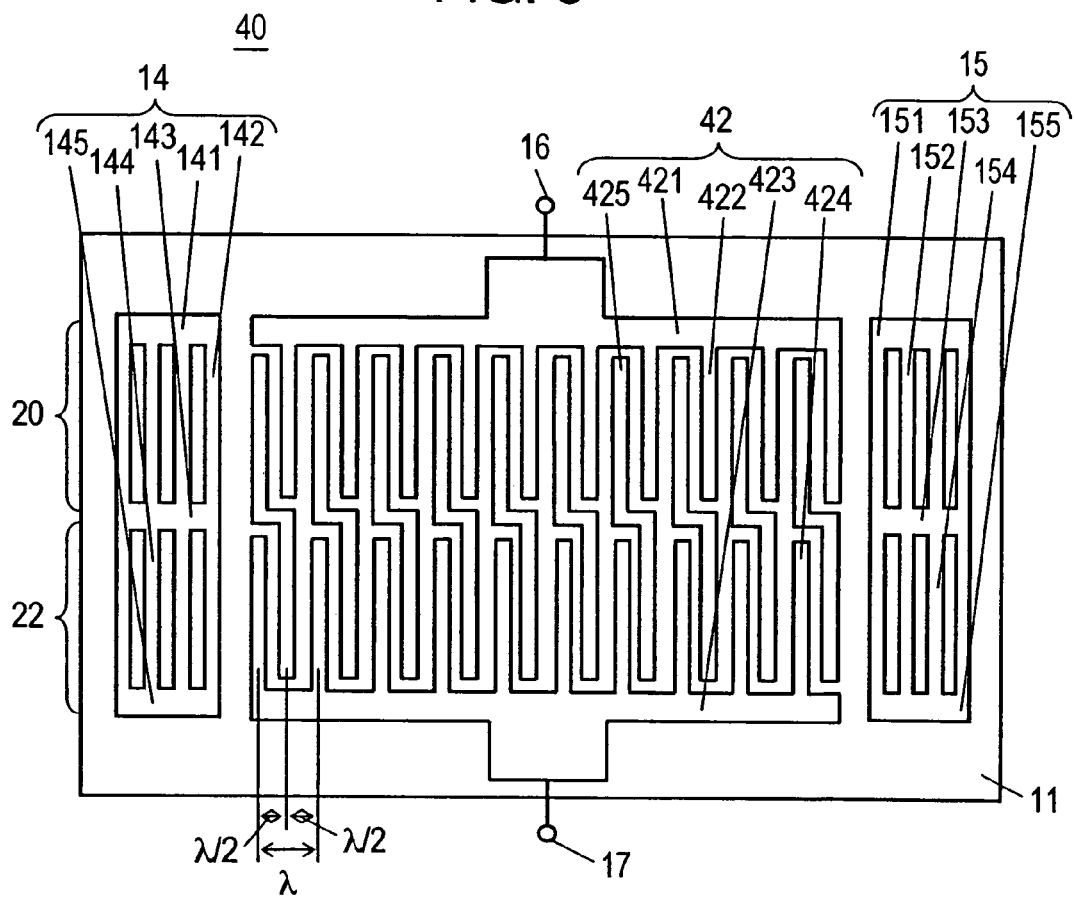
FIG. 6 shows a plan view illustrating a structure of a SAW resonator in accordance with a second exemplary embodiment of the present invention.

FIG. 6 shows a plan view illustrating a structure of a SAW resonator 40 in accordance with the second exemplary embodiment of the present invention. The IDT electrode 42 of SAW resonator 40 includes a first bus-bar electrode 421; a plurality of first finger-electrodes 422 coupled to the first bus-bar electrode 421; a second bus-bar electrode 423; a plurality of second finger-electrodes 424 coupled to the second bus-bar electrode 423; and a plurality of strip-line electrodes 425 standing alone. First finger-electrodes 422 and second finger-electrodes 424 are placed apart from each other by a half wavelength (λ/2) of the SAW wavelength (λ). Strip-line electrodes 425 are placed with a deviation of λ/2 from the respective centers of the first finger-electrodes 422 and second finger-electrodes 424, and are shaped like a dogleg.

In the SAW resonator 10 of the first embodiment, first finger-electrodes 132 and second finger-electrodes 134 are arranged alike so as to directly face each other with respect to the propagating direction of the SAW at intervals of the SAW wavelength λ. The strip-line electrodes 135 are shaped like a straight line. On the other hand, in SAW resonator 40 of the second embodiment, respective finger-electrodes 422 are arranged at intervals of the SAW wavelength λ, and first finger-electrodes 422 are placed with a deviation of λ/2 from second finger-electrodes 424 with respect to the propagating direction of the SAW. Further, the strip-line electrodes 425 are placed such that they deviate by λ/2 from the respective centers of first finger-electrodes 422 and second finger-electrodes 424 and overlap respective finger-electrodes. Strip-line electrodes 425 are bent at right angles at a center of the IDT electrode 42, i.e., they are shaped like a dogleg. As shown in FIG. 6, the respective electrodes overlap with each other in the same overlap length and are placed uniformly along the propagating direction. Other structural points remain unchanged from SAW resonator 10 of the first embodiment, and thus the descriptions thereof are omitted.

The foregoing structure allows first section 20 to function as a first resonating unit and second section 22 to function as a second resonating unit. These resonating units have the characteristics of a SAW resonator. The first and the second resonating units are acoustically coupled together by strip-line electrodes 425, so that the two resonating units are equivalently coupled in series.

SAW resonator 40 in accordance with the second embodiment does not need the common bus-bar electrode, which is included in conventional SAW resonator 1540, and yet, the resonating units in first section 20 and second section 22 are equivalently coupled in series. As a result, the loss can be reduced and the resonator can be downsized.

Figure 7:
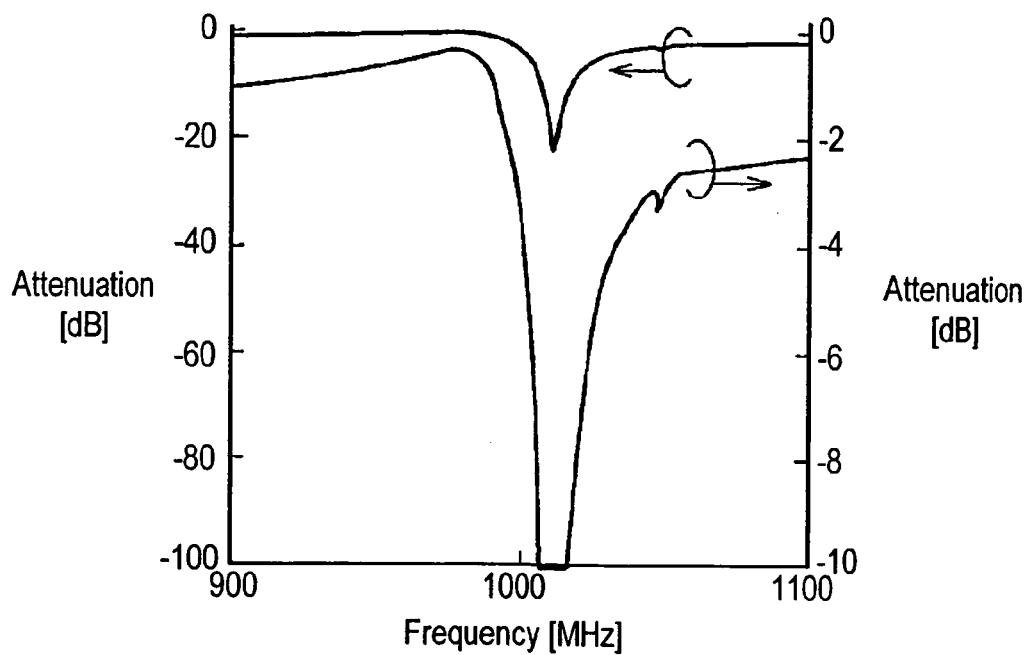
FIG. 7 shows transmission characteristics of the SAW resonator in the second embodiment.

FIG. 7 shows the characteristics of transmission from a first terminal 16 to second terminal 17 of SAW resonator 40. Although in SAW resonator 40, first finger-electrodes 422 and second finger-electrodes 424 do not overlap with each other, they can be acoustically coupled together, thereby obtaining excellent transmission characteristics. In FIG. 7, the X-axis represents a frequency and the Y-axis represents an amount of attenuation.

Figure 8:
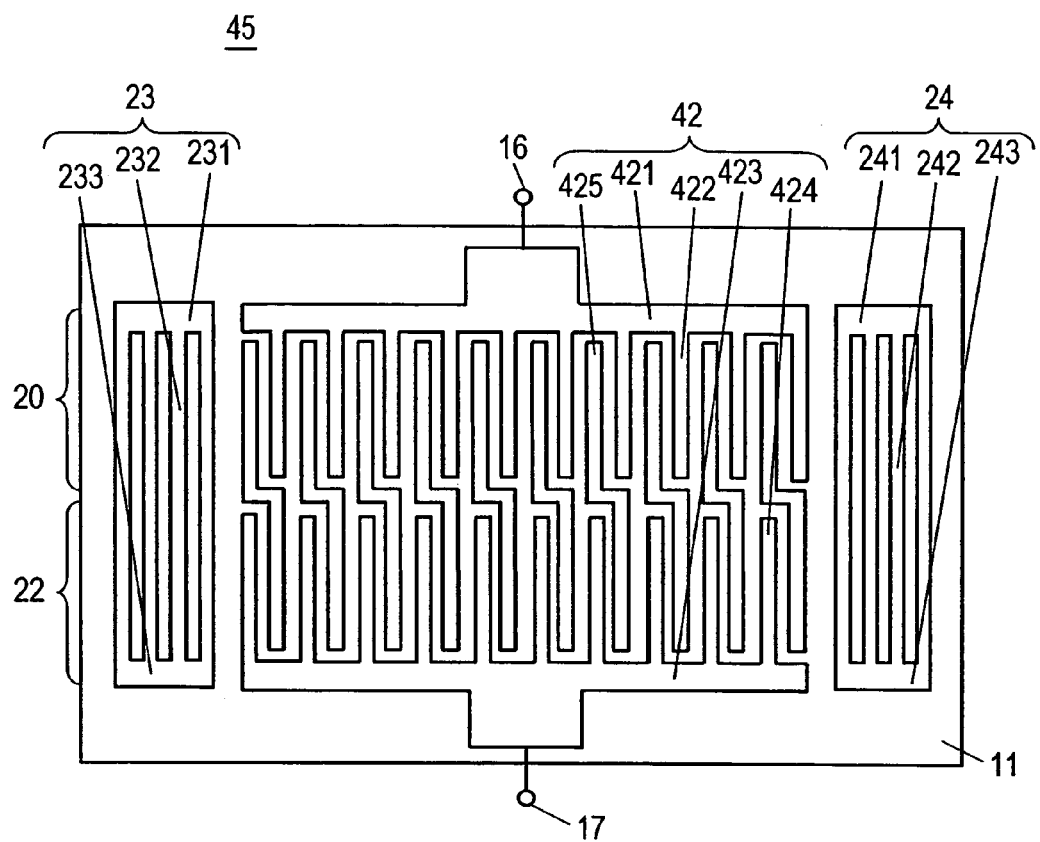
FIG. 8 shows a plan view illustrating a structure of a modified SAW resonator in accordance with the second embodiment.

FIG. 8 shows a plan view illustrating a structure of a modified SAW resonator 45 in accordance with the second embodiment. Modified SAW resonator 45 has reflector electrodes 23 and 24 having a different structure from those of SAW resonator 40, but having the same structure as those of modified SAW resonator 25 in accordance with the first embodiment. This structure allows the SAW resonator 45 to produce characteristics similar to the characteristics discussed previously.

Figure 9:
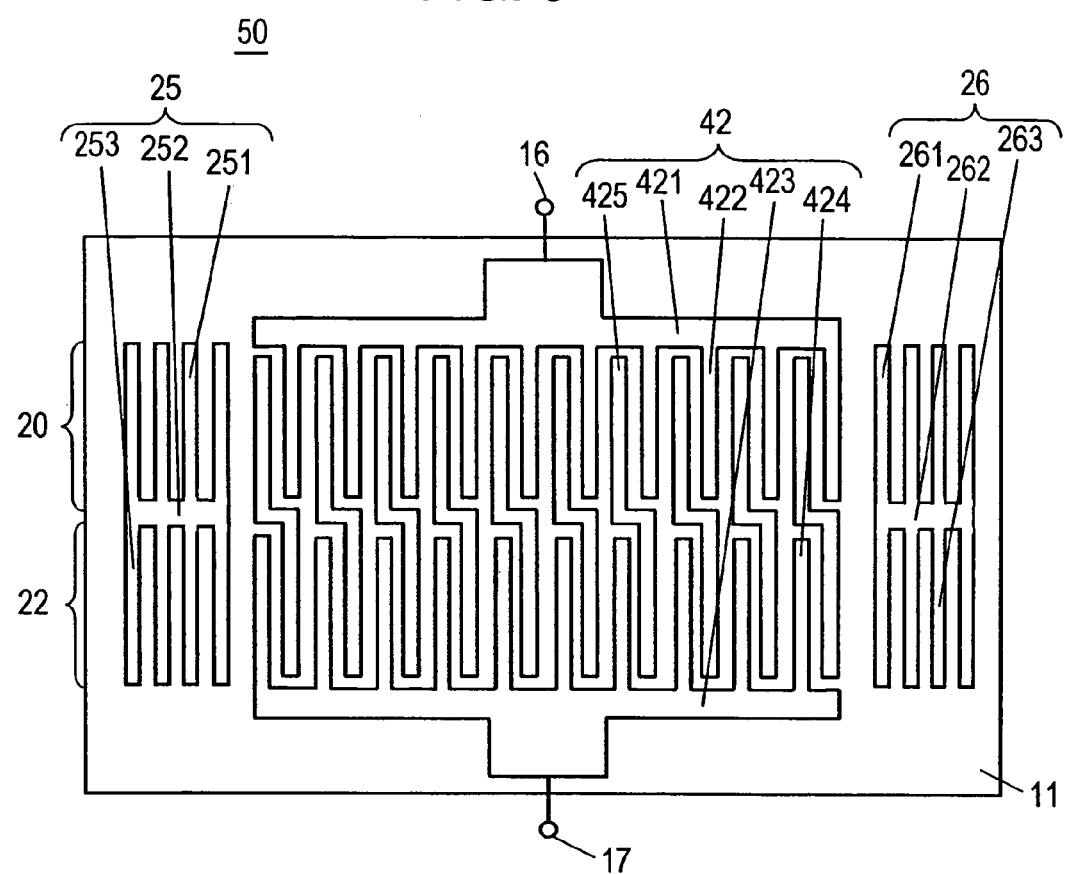
FIG. 9 shows a plan view illustrating a structure of another modified SAW resonator in accordance with the second embodiment.

FIG. 9 shows a plan view illustrating a structure of a modified SAW resonator 50 in accordance with the second embodiment. Modified SAW resonator 50 also has reflector electrodes 25 and 26 different from those of SAW resonator 40, but the same as those of modified SAW resonator 30 in accordance with the first embodiment. This structure allows SAW resonator 50 to produce characteristics similar to the characteristics discussed previously.

The structure of the reflector electrode of the SAW resonator in accordance with the second embodiment is not limited to the foregoing structures. Any structure that can confine the SAW therein is acceptable.

In the second embodiment, first finger-electrodes 422 and second finger-electrodes 424 face each other with a deviation of λ/2 from each other along the propagating direction. However, the present invention is not limited to this structure. For example, the deviation can be λ/4, or another structure is acceptable as long as they are coupled together acoustically by the strip-line electrodes.

In SAW resonators 40, 45, and 50 discussed above, the resonating unit in first section 20 and that in second section 22 have the same overlap length of finger-electrodes 422 and finger-electrodes 424 with respective strip-line electrodes 425. However, the present invention is not limited to this structure. The capacitance can be adjusted by changing the respective overlap lengths.

The first resonating unit can have a different resonance frequency from that of the second resonating unit as long as they are acoustically coupled by the strip-line electrodes.

In this embodiment, every first finger-electrode 422 and every second finger-electrode 424 forming the IDT electrode are acoustically coupled to each other by the strip-line electrodes. However, the present invention is not limited to this structure. For example, parts of the sections can be coupled acoustically, or the IDT electrode used in the conventional SAW resonator 1500 can be included.

In the second embodiment, as described in the first embodiment, dummy electrodes can be used.

As discussed above, the SAW resonator of the present invention includes two resonating units coupled together acoustically by the strip-line electrodes, and the resonating units are coupled in series. This structure allows a reduction in loss and downsizing of the SAW resonator. As a result, a SAW resonator having excellent transmission characteristics is obtained.

Exemplary Embodiment 3

Figure 10:
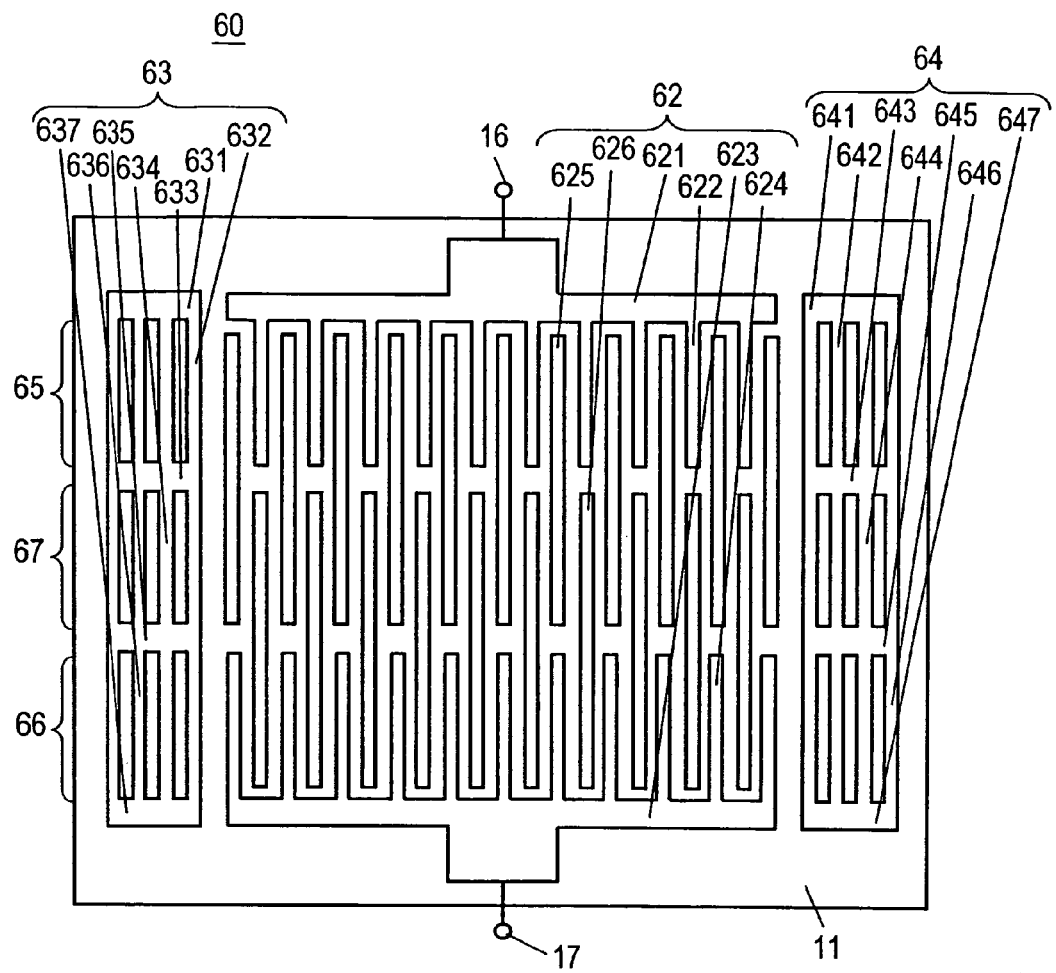
FIG. 10 shows a plan view illustrating a structure of a SAW resonator in accordance with a third exemplary embodiment of the present invention.

FIG. 10 shows a plan view illustrating a SAW resonator 60 in accordance with the third exemplary embodiment of the present invention. The SAW resonator 60 includes an IDT electrode 62; and reflector electrodes 63 and 64 disposed on both sides of IDT electrode 62.

The IDT electrode 62 includes a first bus-bar electrode 621; a plurality of first finger-electrodes 622 coupled to first bus-bar electrode 621; a second bus-bar electrode 623; a plurality of second finger-electrodes 624 coupled to second bus-bar electrode 623; a plurality of first strip-line electrodes 625 shaped like a straight line standing alone; and a plurality of second strip-line electrodes 626 shaped like a straight line standing alone.

First finger-electrodes 622 and second finger-electrodes 624 are respectively arranged at intervals of a SAW wavelength λ. These two electrodes do not overlap with each other, and yet, they deviate by λ/2 from each other along the propagating direction in a face-to-face manner with a given space in-between. First strip-line electrodes 625 and second strip-line electrodes 626 are placed with a deviation of λ/2 from the respective centers of first finger-electrodes 622 and second finger-electrodes 624. As FIG. 10 shows, the first strip-line electrodes 625 and second finger-electrodes 624 are arranged alike along the SAW propagating direction in a face-to-face manner. Second strip-line electrodes 626 and first finger-electrodes 622 are arranged alike along the SAW propagating direction in a face-to-face manner.

The foregoing configuration forms the following structure: first finger-electrodes 622 and first strip-line electrodes 625 overlap with each other, the second strip-line electrodes 626 and the second finger-electrodes 624 overlap with each other, and first strip-line electrodes 625 and second strip-line electrodes 626 overlap with each other. Meanwhile, first strip-line electrodes 625 and second strip-line electrodes 626 overlap with each other in a given length between first finger-electrodes 622 and second finger-electrodes 624. These electrodes overlap each other with the same overlap length, and are arranged uniformly along the SAW propagating direction.

Reflector electrodes 63 and 64 are shaped so as to correspond to the structure of IDT electrode 62. In particular, reflector electrode 63 on the left side is formed of four common reflector-electrodes 631, 633, 635 and 637 and plural strip-line electrodes 632, 634 and 636 are electrically coupled to these four electrodes. The reflector electrode 64 on the right side is formed, in the same manner, of four common reflector-electrodes 641, 643, 645 and 647 and plural strip-line electrodes 642, 644 and 646 are electrically coupled to these four electrodes.

The foregoing structure allows a first section 65, a second section 66, and a third section 67, where first strip-line electrodes 625 and second strip-line electrodes 626 overlap with each other, to work respectively as a first resonating unit, a second resonating unit, and a third resonating unit, all of which have the characteristics of the SAW resonator.

The resonating unit in first section 65 and that in the third section 67 are acoustically coupled together by first strip-line electrode 625. Further, the resonating unit in third section 67 and that in second section 66 are acoustically coupled together by second strip-line electrode 626. Thus, the three resonating units are equivalently coupled in series.

As a result, the resonating unit in first section 65, that in third section 67 and that in second section 66 are equivalently coupled in series without using a common bus-bar electrode. Thus, the transmission characteristics are not lowered due to the resisting component of the common bus-bar electrode, the loss can be reduced, and the SAW resonator can be downsized.

The present invention is not limited to the structure of reflector electrodes 63 and 64 of the third embodiment. For instance, the reflector electrodes can have the same structure as those in the first or the second embodiment, and any structure that can confine the SAW therein is acceptable.

In this embodiment, the three resonating units are coupled in series. However, the present invention is not limited to this structure. For example, as the number of stages of the strip-line electrodes increases, more resonating units can be coupled, so that an advantage similar to that of the SAW resonator in accordance with the third embodiment is obtainable. The three resonating units in this embodiment have the same overlap length. However, the capacitance can be adjusted by changing the respective overlap lengths.

The three resonating units can have different resonance frequencies from each other as long as they are coupled with each other by the strip-line electrodes.

In this embodiment, every first finger-electrode 622 and every second finger-electrode 624 forming IDT electrode 62 are acoustically coupled together by the strip-line electrodes. However, the present invention is not limited to this structure. For example, parts of the sections can be coupled acoustically, or the IDT electrode used in the conventional SAW resonator 1500 can be included.

As discussed above, the SAW resonator in accordance with the third embodiment takes advantage of the acoustic coupling between the first strip-line electrodes and the second strip-line electrodes, thereby constructing resonating units and coupling those units in series. As a result, a further downsized SAW resonator having excellent characteristics with a smaller loss is obtainable.

Exemplary Embodiment 4

Figure 11:
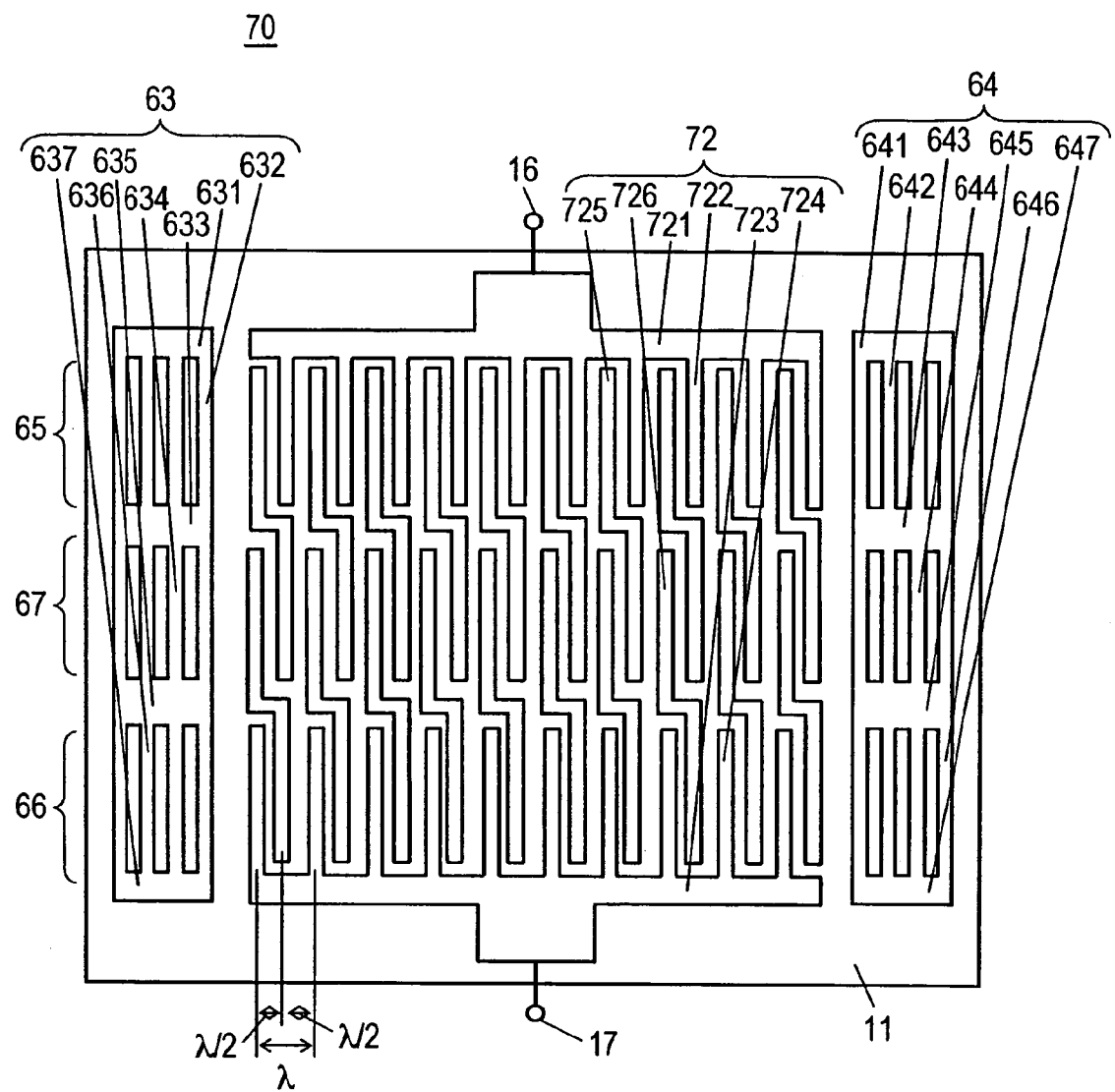
FIG. 11 shows a plan view illustrating a structure of a SAW resonator in accordance with a fourth exemplary embodiment of the present invention.

FIG. 11 shows a plan view illustrating a structure of a SAW resonator 70 in accordance with the fourth exemplary embodiment of the present invention. SAW resonator 70 has a different IDT electrode from that of SAW resonator 60 of the third embodiment. In particular, IDT electrode 72 of the SAW resonator 70 of the fourth embodiment includes a first bus-bar electrode 721; a plurality of first finger-electrodes 722 coupled to first bus-bar electrode 721; a second bus-bar electrode 723; a plurality of second finger-electrodes 724 coupled to second bus-bar electrode 723; a plurality of first strip-line electrodes 725 shaped like doglegs; and a plurality of second strip-line electrodes 726 shaped like doglegs and placed at different positions than first strip-line electrodes 725.

First finger-electrodes 722 and second finger-electrodes 724 are respectively arranged at intervals of SAW wavelength λ. These electrodes 724 do not overlap with each other respectively, and yet, they deviate by λ/2 from each other along the propagating direction in a face-to-face manner with a given space in-between. First strip-line electrodes 725 and second strip-line electrodes 726, each one shaped like a dogleg, are placed with a deviation of λ/2 from the respective centers of first finger-electrodes 722 and the second finger-electrodes 724.

As FIG. 11 shows, the first strip-line electrodes 725 and first finger-electrodes 722 overlap with each other, and first strip-line electrodes 725 bend at right angles, so that they overlap with second strip-line electrodes 726. Second strip-line electrodes 726 overlap the second finger-electrodes 724, and bend at right angles, so that they overlap with first strip-line electrodes 725 as discussed above. In other words, first strip-line electrodes 725 and second strip-line electrodes 726 overlap with each other in a given length between first finger-electrodes 722 and second finger-electrodes 724. The respective overlap lengths are the same, and these electrodes are arranged uniformly along the SAW propagating direction.

Reflector electrodes 63 and 64 remain unchanged from those of the SAW resonator 60 of the third embodiment, and the description thereof is thus omitted.

The resonating unit in first section 65 and that in third section 67 are acoustically coupled together by first strip-line electrodes 725. Further, the resonating unit in third section 67 and that in second section 66 are acoustically coupled by second strip-line electrodes 726. Thus, the three resonating units are equivalently coupled in series.

The foregoing structure allows first section 65 to work as a first resonating unit, and second section 66 to work as a second resonating unit. The foregoing structure also allows a certain area of third section 67, in which area first strip-line electrodes 725 and second strip-line electrodes 726 overlap with each other, to work as a third resonating unit. These resonating units are acoustically coupled by first strip-line electrodes 725 and the second strip-line electrodes 726, so that they are equivalent to the three resonating units coupled in series. The resonating unit in first section 65, that in third section 67, and that in second section 66 are equivalently coupled in series without using a common bus-bar electrode. As a result, a further downsized SAW resonator with lower loss is obtainable.

The present invention is not limited to the structure of the reflector electrodes 63 and 64 of the third embodiment. For instance, the reflector electrodes can have the same structure as those in the first or the second embodiment, and any structure that can confine a SAW therein is acceptable.

In this embodiment, the three resonating units are coupled in series. However, the present invention is not limited to this structure. For example, as the number of stages of the strip-line electrodes increases, more resonating units can be coupled, so that an advantage similar to that of the SAW resonator in accordance with the third embodiment is obtainable. The three resonating units in this embodiment have the same overlap length. However, the capacitance can be adjusted by changing the respective overlap lengths.

The three resonating units can have different resonance frequencies from each other as long as they are acoustically coupled with each other by the strip-line electrodes.

In this embodiment, the respective resonating units in the first section 65, second section 66 and third section 67 are coupled in series, i.e., three stages are coupled in series. However, the present invention is not limited to the structure of three stages. The number of stages of series coupling can be increased, and for this purpose, the number of stages of strip-line electrodes can be increased.

For instance, the strip-line electrodes include electrodes ranging from a plurality of the first strip-line electrodes to a plurality of the "N"th strip-line electrodes (N is an integer not less than 2). Parts of the first strip-line electrodes are placed such that they overlap with the first finger-electrodes at a position deviated by λ/2 from the center of the first finger-electrodes. Parts of the "N"th strip-line electrodes are placed such that they overlap with the second finger-electrodes at a position deviated by λ/2 from the center of the second finger-electrodes. Further, the following strip-line electrodes are placed such that they have an area where they overlap with each other in a given length: an extension of the first strip-line electrodes, the second strip-line electrodes, "m"th strip-line electrodes, "m+1"th strip-line electrodes ("m" is an integer not less than 2, and not more than N−2), "N−1"th strip-line electrodes and an extension of the "N"th strip-line electrodes.

The foregoing structure allows the respective areas, such as an area where the first finger-electrodes and the first strip-line electrodes overlap with each other, and areas where the second finger-electrodes and the "N"th strip-line electrodes overlap with each other, and areas where "m"th strip-line electrodes and "m+1"th strip-line electrodes overlap with each other in a given length, to work as resonating units respectively. Thus, a SAW resonator, in which electrodes ranging from the first resonating unit to the "N+1"th resonating unit are coupled in series by electrodes ranging from the first strip-line electrodes to the "N"th strip-line electrodes, is obtainable.

The structure discussed above allows the SAW resonator to be divided by increasing the number of stages of resonating units, so that this structure is useful for an antenna duplexer which needs high power durability.

In the fourth embodiment, first finger-electrodes 722 are deviated by λ/2 from second finger-electrodes 724 along the SAW propagating direction, and these two electrodes 722 and 724 are arranged in a face-to-face manner. The present invention is not limited to this structure. For example, the deviation can be λ/4 instead of λ/2, and any structure that is acoustically coupled by the strip-line electrode is acceptable.

Figure 12:
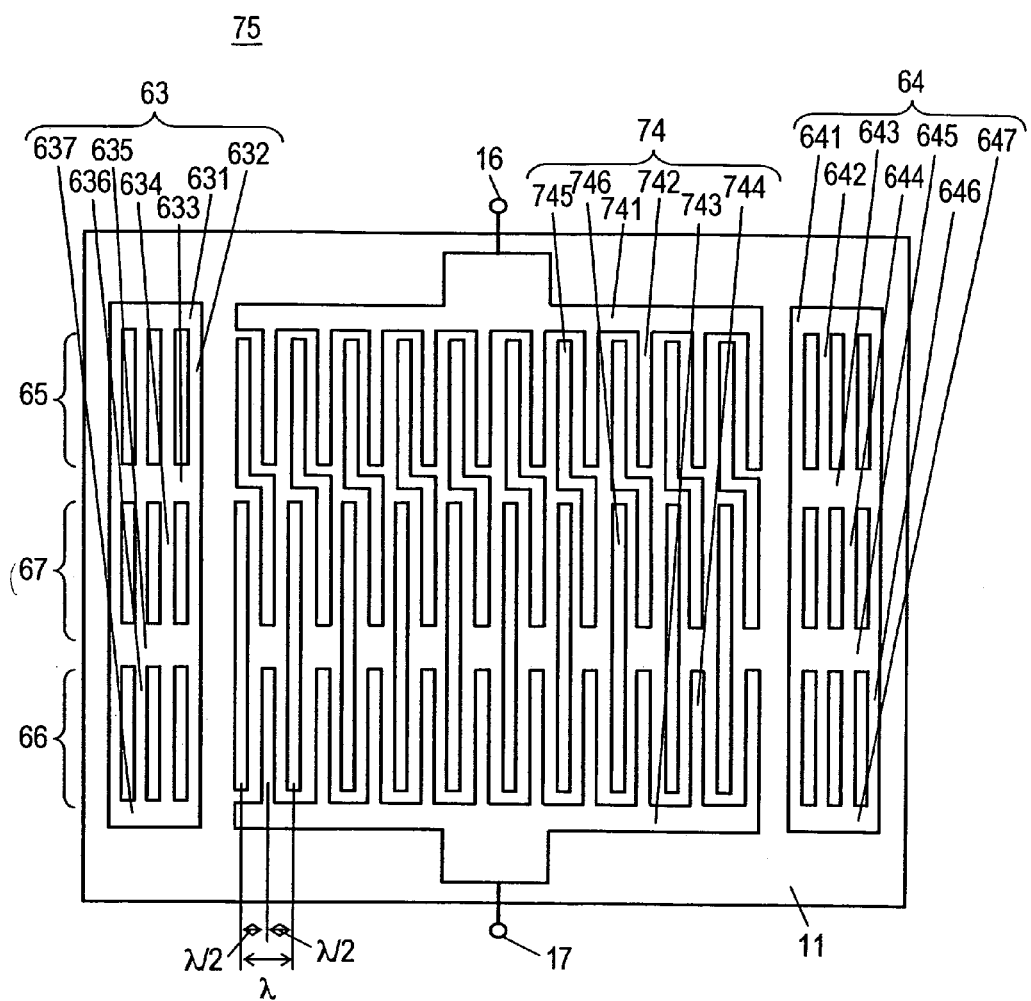
FIG. 12 shows a plan view illustrating a structure of a modified SAW resonator in accordance with the fourth embodiment.

FIG. 12 shows a plan view illustrating a modified SAW resonator 75 in accordance with the fourth embodiment. Modified SAW resonator 75 has a different IDT electrode 74 from that of SAW resonator 70. In particular, IDT electrode 74 of SAW resonator 75 includes a first bus-bar electrode 741; a plurality of first finger-electrodes 742 coupled to first bus-bar electrode 741; a second bus-bar electrode 743; a plurality of second finger-electrodes 744 coupled to second bus-bar electrode 743; a plurality of first strip-line electrodes 745 shaped like doglegs; and a plurality of second strip-line electrodes 746 shaped like a straight-line.

First finger-electrodes 742 and second finger-electrodes 744 are respectively arranged at intervals of a SAW wavelength λ. These two kinds of electrodes do not overlap with each other respectively, and yet, they are arranged alike along the SAW propagating direction in a direct face-to-face manner. First strip-line electrodes 745 and first finger-electrodes 742 overlap with each other with a deviation of λ/2 from each other along the SAW propagating direction. First strip-line electrodes 745 are bent at an intermediate position at right angles, so that they overlap with second strip-line electrodes 746. Second strip-line electrodes 746 are shaped like a straight line, and placed with a deviation of λ/2 with respect to second finger-electrodes 744 along the SAW propagating direction. Second strip-line electrodes 746 and first strip-line electrodes 745 overlap with each other at a center section. This structure produces characteristics similar to the characteristic discussed previously.

The three resonating units in this embodiment have the same overlap length. However, the capacitance can be adjusted by changing the respective overlap lengths.

The three resonating units can have different resonance frequencies from each other as long as they are acoustically coupled with each other by the strip-line electrodes.

In this embodiment, every first finger-electrode 742 and every second finger-electrode 744 forming IDT electrode 74 are acoustically coupled together by the strip-line electrodes. However, the present invention is not limited to this structure. For example, parts of the sections can be coupled acoustically, or the IDT electrode used in the conventional SAW resonator 1500 can be included.

As discussed above, the SAW resonator in accordance with the fourth embodiment takes advantage of the acoustic coupling between first strip-line electrodes and the second strip-line electrodes. As a result, a further downsized SAW resonator having excellent characteristics with lower loss is obtainable. Since no common bus-bar electrodes are disposed between the respective resonating units, no leakage of the SAW to the bus-bar electrodes is found.

Exemplary Embodiment 5

Figure 13:
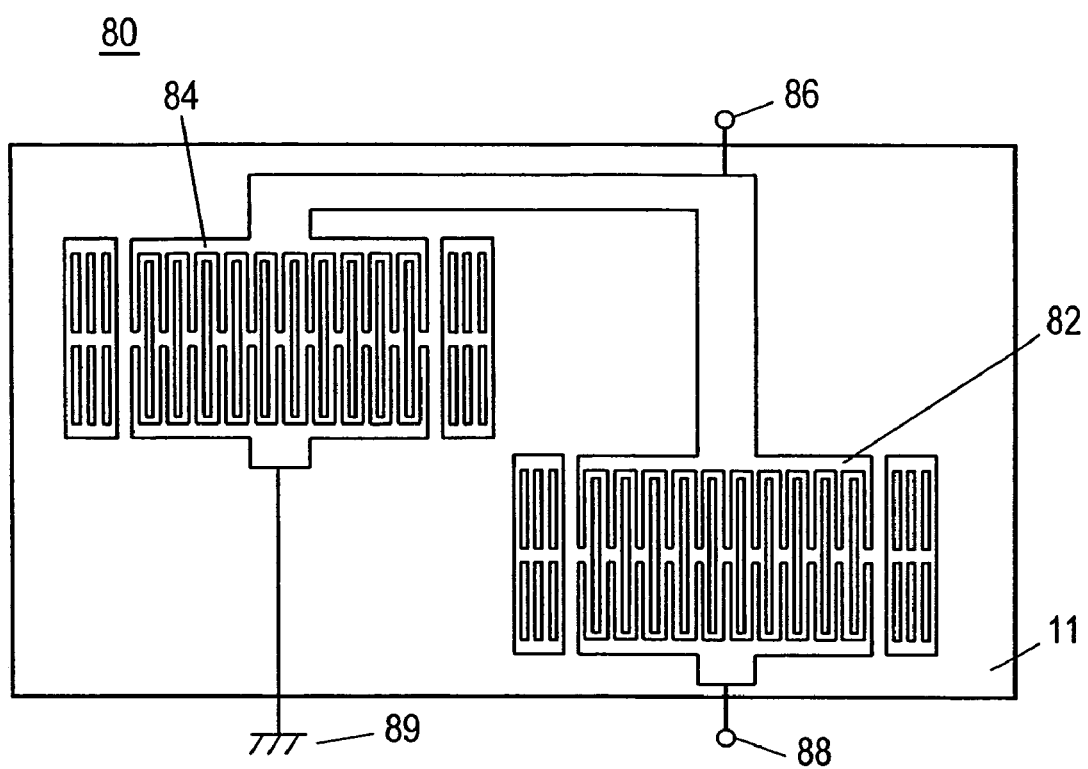
FIG. 13 shows a plan view illustrating a structure of a SAW resonator in accordance with a fifth exemplary embodiment of the present invention.

FIG. 13 shows a plan view illustrating a structure of a SAW filter 80 in accordance with the fifth exemplary embodiment. SAW filter 80 is formed of two SAW resonators 10 of the first embodiment, and resonators 10 in the fifth embodiment are shaped like the letter L.

SAW filter 80 includes a first SAW resonator 82 and a second SAW resonator 84, both being formed on piezoelectric substrate 11. First SAW resonator 82 is coupled between a first terminal 86 and a second terminal 88 in series, and second SAW resonator 84 is coupled between second terminal 86 and a ground terminal 89. SAW resonators 82 and 84 have the same structure as SAW resonator 10 in accordance with the first embodiment. However, the resonance frequency of first SAW resonator 82 is higher than that of second SAW resonator 84.

The foregoing structure forms SAW filter 80. First SAW resonator 82 and second SAW resonator 84 are not equipped with a common bus-bar electrode, so that no resistance loss due to the common bus-bar is found. As a result, this structure can reduce the loss of SAW filter 80, so that a SAW filter having excellent high power durability and characteristics is obtainable.

In this embodiment, the SAW filter is formed of the two SAW resonators shaped like the letter L. However, the present invention is not limited to this structure. The SAW resonators used in this embodiment can be those described in the first embodiment through the fourth embodiment as long as they have a structure acoustically coupled by a strip-line electrode. Among a plurality of SAW resonators, at least one of them can be in accordance with the one described in one of the previous four embodiments. Further, the SAW resonator of the present invention can be combined with a SAW filter of a vertical mode.

The SAW resonator of the present invention can be applied to an antenna duplexer. In this case, an impedance in an attenuation band, i.e., a reflection coefficient of the reflection characteristics, can be increased. As a result, the loss of the antenna duplexer can be reduced and a sophisticated performance of the antenna duplexer can be expected.

As discussed above, in the fifth embodiment, two SAW resonators, each one of them being formed of resonating units acoustically coupled together by strip-line electrodes, are shaped like the letter L, thereby forming a SAW filter or an antenna duplexer. This structure provides a reduction in the loss. The SAW resonators do not need common bus-bar electrodes between the respective resonating units, so that the leakage of the SAW to the common bus-bar electrodes can be reduced.

In this embodiment, the SAW resonator shown in FIG. 1 is used. However, the SAW filter or the antenna duplexer of the present invention is not limited to this structure. A variety of SAW resonators described in the first embodiment through the fourth embodiment can be used, or they can be combined.

Exemplary Embodiment 6

Figure 14:
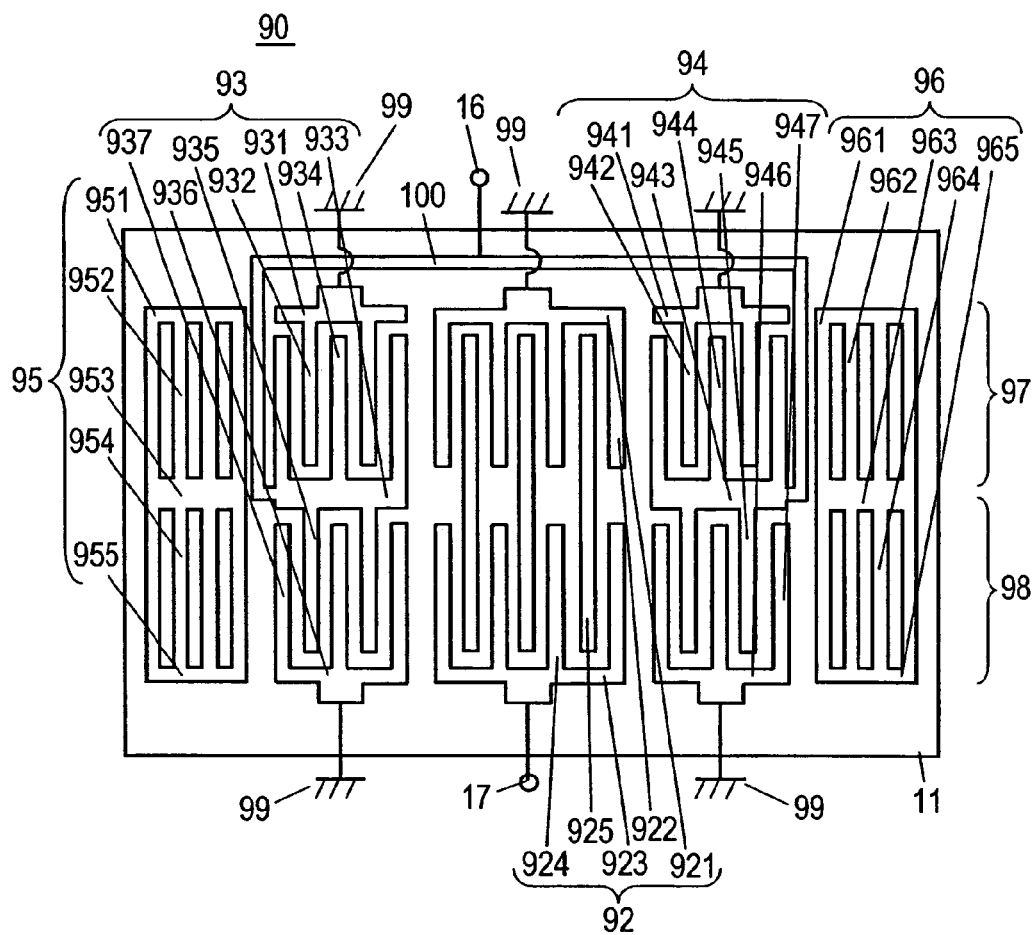
FIG. 14 shows a plan view illustrating a structure of a SAW resonator in accordance with a sixth exemplary embodiment of the present invention.

FIG. 14 shows a plan view illustrating a structure of a SAW filter 90 in accordance with the sixth exemplary embodiment of the present invention. SAW filter 90 includes a piezoelectric substrate 11 on which the following elements are formed: a first IDT electrode 92; a second IDT electrode 93; a third IDT electrode 94; reflector electrodes 95 and 96 disposed outside of the foregoing IDT electrodes. On either side of first IDT electrode 92 is placed second IDT electrode 93 and third IDT electrode 94, respectively. Reflector electrodes 95 and 96 are disposed outside of IDT electrodes 93 and 94, respectively.

First IDT electrode 92 includes a first bus-bar electrode 921; first finger-electrodes 922 coupled to first bus-bar electrode 921; a second bus-bar electrode 923; second finger-electrodes 924 coupled to second bus-bar electrode 923; and strip-line electrodes 925 overlapping with first finger-electrodes 922 and second finger-electrodes 924 respectively.

Second IDT electrode 93 includes a first bus-bar electrode 931; first finger-electrodes 932 coupled to the first bus-bar electrode 931; a second bus-bar electrode 933; second finger-electrodes 934 coupled to second bus-bar electrode 933; third finger-electrodes 935 coupled to the second bus-bar electrode 933; a third-bus-bar electrode 936; and fourth finger-electrodes 937 coupled to third bus-bar electrode 936.

Third IDT electrode 94 includes a first bus-bar electrode 941; first finger-electrodes 942 coupled to first bus-bar electrode 941; a second bus-bar electrode 943; second finger-electrodes 944 coupled to second bus-bar electrode 943; third finger-electrodes 945 coupled to second bus-bar electrode 943; a third-bus-bar electrode 946; and fourth finger-electrodes 947 coupled to third bus-bar electrode 946.

Reflector electrode 95 on the left side includes common reflector electrodes 951, 953 and 955; and strip-line electrodes 952 and 954 coupled to the electrodes 951, 953 and 955 respectively.

Reflector electrode 96 on the right side includes common reflector electrodes 961, 963 and 965; and strip-line electrodes 962 and 964 coupled to the electrodes 961, 963 and 965, respectively.

First and third bus-bar electrodes 931 and 936 of second IDT electrode 93, first and third bus-bar electrodes 941 and 946 of third IDT electrode 94, and first bus-bar electrode 921 of first IDT electrode 92 are respectively coupled to a grounding terminal 99.

Second bus-bar electrode 933 of second IDT electrode 93 is coupled to second bus-bar electrode 943 of third IDT electrode 94 by connecting a wire electrode 100, which is coupled to a first terminal 16. On the other hand, second bus-bar electrode 923 of first IDT electrode 92 is coupled to second terminal 17.

In other words, first IDT electrode 92 includes first finger-electrodes 922 and second finger-electrodes 924 coupled together by strip-line electrodes 925. Second electrode 93 and third IDT electrode 94 respectively include two IDT electrode patterns coupled in parallel. In this structure, the respective finger-electrodes are placed at such positions that SAWs do not cancel each other, so that SAW filter 90 works as a vertically coupled filter.

First IDT electrode 92 is equivalently coupled in series, and second IDT electrode 93 is coupled in parallel. Thus, adjustments of the number of finger-electrodes and the overlap lengths allow impedance conversion. Since first IDT electrode 92 has the same structure as the first embodiment, i.e. coupling by strip-line electrodes 925, a common bus-bar electrode is not needed. Thus, loss due to resistance of the common bus-bar electrode can be reduced.

In the sixth embodiment, the first IDT electrode includes first finger-electrodes and second finger-electrodes coupled together by strip-line electrodes. However, the first IDT electrode is not limited to this structure. For instance, dummy electrodes can be prepared as in the first embodiment, or the resonating units described in the first embodiment through the fourth embodiment can be used.

In this embodiment, SAW filter 90 having three IDT electrodes is described. However, the present invention is not limited to this structure, and the number of IDT electrodes can be further increased. The sixth embodiment refers to a SAW filter but the structure discussed here is applicable to an antenna duplexer as well. The antenna duplexer according to the present invention may include a plurality of SAW filters unitarily formed and having different characteristics in a pass band and a rejection band.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A surface acoustic wave (SAW) resonator comprising:
a piezoelectric substrate;
an interdigital transducer (IDT) electrode formed on said piezoelectric substrate; and
a reflector electrode adjacent to said IDT electrode,
wherein said IDT electrode comprises a plurality of first finger-electrodes, a plurality of second finger electrodes, a plurality of strip-line electrodes, a first bus-bar electrode, and a second bus-bar electrode;
wherein said first finger-electrodes and said second finger-electrodes do not overlap with each other, but are acoustically coupled together by said strip line electrodes,
wherein the first finger-electrodes are coupled to said first bus-bar electrode;
wherein the second finger-electrodes are coupled to said second bus-bar electrode;
wherein the strip-line electrodes are disposed at positions for exciting surface acoustic waves between said first bus-bar electrode and said second bus-bar electrode,
wherein said strip-line electrodes include a plurality of first strip-line electrodes to a plurality of N-th strip-line electrodes, N being an integer of 2 or more, wherein a portion of said first strip-line electrodes is disposed so as to overlap with said first finger-electrodes at a position deviated by $\lambda/2$ from the center of said first finger-electrodes, $\lambda$ being a propagation wavelength of a surface acoustic wave, wherein a portion of said N-th strip-line electrodes is disposed so as to overlap with said second finger-electrodes at a position deviated by $\lambda/2$ from the center of said second finger-electrodes, $\lambda$ being the propagation wavelength of a surface acoustic wave, wherein said first strip-line electrodes to said N-th strip-line electrodes are sequentially arranged to overlap mutually at a specified length, wherein said IDT electrode and said reflector electrode adjacent thereto constitute N+1 resonator units, and wherein said resonator units are connected in series by way of said strip-line electrodes, wherein said N+1 resonator units are different in resonance frequency at least between adjacent resonator units, and are coupled acoustically by said strip-line electrodes.

2. The SAW resonator of claim 1, wherein said first strip-line electrodes to said N-th strip-line electrodes are disposed so that m-th strip-line electrode and m+1-th strip-line electrode may overlap mutually at a specified length, m being an integer of 1 or more and N or less, wherein an overlapping region of said first finger-electrodes and said first strip-line electrodes constitutes a first resonator unit, wherein an overlapping region of said second finger-electrodes and said N-th strip-line electrodes constitutes a second resonator unit, wherein overlapping regions of said m-th strip-line electrodes and said m+1 -th strip line electrodes constitute N−1 resonator units, and wherein said first resonator unit to said N+1 -th resonator units are connected in series by way of said first strip-line electrodes to said N-th strip-line electrodes.

3. The SAW resonator of claim 1, wherein at least one of said strip-line electrodes and said N-th strip-line electrodes is shaped like a dogleg.

4. The SAW resonator of claim 1, wherein a plurality of said first finger-electrodes and said second finger-electrodes are disposed in a period of one wavelength of the propagation wavelength of a surface acoustic wave, and are arranged at the same positions with respect to the propagation direction of the surface acoustic wave.

5. The SAW resonator of claim 1, wherein a plurality of said first finger-electrodes and said second finger-electrodes are disposed in a period of one wavelength of propagation wavelength of a surface acoustic wave, and are arranged at positions deviated by a specific distance mutually with respect to the propagation direction of the surface acoustic wave.

6. The SAW resonator of claim 5, wherein the specific distance is $\lambda/2$, where $\lambda$=a wavelength of the SAW.

7. The SAW resonator of claim 1, wherein said N+1 resonator units are mutually different in the overlap length in order to adjust the capacitance.

8. A surface acoustic wave (SAW) resonator comprising:

a piezoelectric substrate;

an interdigital transducer (IDT) electrode formed on said piezoelectric substrate; and a reflector electrode disposed adjacent to said IDT electrode, wherein said IDT electrode comprises a plurality of first finger-electrodes, a plurality of second finger-electrodes and a plurality of strip-line electrodes, wherein said first finger-electrodes and said second finger-electrodes do not overlap with each other, but are acoustically coupled together by said strip-line electrodes, wherein said strip-line electrodes overlap with at least one of said first finger-electrodes and said second finger-electrodes, wherein said IDT electrode and said reflector electrode form at least two resonating units, wherein said at least two resonating units are coupled in series via said strip-line electrodes, and wherein said resonator units are different in resonance frequency at least between adjacent resonator units, and are coupled acoustically by said strip-line electrodes.

* * * * *